(12) United States Patent
Kim et al.

(10) Patent No.: US 12,412,630 B2
(45) Date of Patent: Sep. 9, 2025

(54) MEMORY DEVICE THAT PERFORMS ERASE OPERATION TO PRESERVE DATA RELIABILITY

(71) Applicant: Samsung Electronics Co., Ltd., Suwon-si (KR)

(72) Inventors: Jinyoung Kim, Suwon-si (KR); Sehwan Park, Suwon-si (KR); Ilhan Park, Suwon-si (KR); Youngdeok Seo, Suwon-si (KR); Dongmin Shin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 147 days.

(21) Appl. No.: 18/378,540

(22) Filed: Oct. 10, 2023

(65) Prior Publication Data

US 2024/0038309 A1 Feb. 1, 2024

Related U.S. Application Data

(63) Continuation of application No. 17/503,197, filed on Oct. 15, 2021, now Pat. No. 11,817,153.

(30) Foreign Application Priority Data

Dec. 22, 2020 (KR) .......................... 10-2020-0181181

(51) Int. Cl.
| | | |
|---|---|---|
| *G11C 16/04* | (2006.01) | |
| *G11C 16/08* | (2006.01) | |
| *G11C 16/16* | (2006.01) | |
| *G11C 16/24* | (2006.01) | |
| *G11C 16/26* | (2006.01) | |

(52) U.S. Cl.
CPC .......... *G11C 16/16* (2013.01); *G11C 16/0433* (2013.01); *G11C 16/08* (2013.01); *G11C 16/24* (2013.01); *G11C 16/26* (2013.01)

(58) Field of Classification Search
CPC ..... G11C 16/16; G11C 16/0433; G11C 16/08; G11C 16/24; G11C 16/26
USPC ...................................................... 365/185.29
See application file for complete search history.

(56) References Cited

U.S. PATENT DOCUMENTS

| | | | |
|---|---|---|---|
| 5,450,360 A | * | 9/1995 | Sato .................. G11C 16/16 365/185.11 |
| 8,837,228 B2 | | 9/2014 | Nam et al. |
| 8,842,472 B2 | | 9/2014 | Kim |
| 9,025,389 B2 | | 5/2015 | Kim |

(Continued)

FOREIGN PATENT DOCUMENTS

| | | |
|---|---|---|
| KR | 101748884 B1 | 6/2017 |
| KR | 1020190026431 A | 3/2019 |
| KR | 1020190139519 A | 12/2019 |

*Primary Examiner* — Ly D Pham
(74) *Attorney, Agent, or Firm* — Muir Patent Law, PLLC

(57) ABSTRACT

A memory device may include a memory block and a control circuit. The memory block may include a first sub-block and a second sub-block that are connected between a common source line and a plurality of bit lines and may be vertically stacked. The control circuit may be configured to select any one of the common source line and the plurality of bit lines as a transmission path of an erase voltage based on positions of the first sub-block and the second sub-block, and perform erase operations on the first sub-block and the second sub-block in units of sub-blocks.

20 Claims, 27 Drawing Sheets

(56) References Cited

U.S. PATENT DOCUMENTS

| | | | |
|---|---|---|---|
| 9,153,330 B2 | 10/2015 | Aritome | |
| 9,595,337 B2 | 3/2017 | Maeda | |
| 9,620,217 B2 | 4/2017 | Lue et al. | |
| 10,354,737 B2 | 7/2019 | Hu | |
| 10,381,095 B1* | 8/2019 | Date | G11C 16/16 |
| 10,497,452 B2 | 12/2019 | Lee | |
| 10,600,487 B2 | 3/2020 | Nam et al. | |
| 10,614,891 B2 | 4/2020 | Park et al. | |
| 10,777,278 B2 | 9/2020 | Lee et al. | |
| 2012/0134210 A1* | 5/2012 | Maeda | G11C 16/08 |
| | | | 365/185.11 |
| 2016/0049201 A1* | 2/2016 | Lue | G11C 16/16 |
| | | | 365/185.11 |
| 2016/0267995 A1* | 9/2016 | Chang | G11C 16/0475 |
| 2019/0279719 A1* | 9/2019 | Lee | G11C 16/32 |
| 2019/0279720 A1* | 9/2019 | Nam | H10B 43/40 |
| 2019/0348129 A1 | 11/2019 | Chin et al. | |
| 2020/0388335 A1 | 12/2020 | Chibvongodze et al. | |
| 2020/0411105 A1 | 12/2020 | Lee et al. | |
| 2020/0411106 A1* | 12/2020 | Nam | H10B 43/27 |
| 2021/0249087 A1* | 8/2021 | Oh | G11C 16/16 |

\* cited by examiner

MEMORY DEVICE THAT PERFORMS ERASE OPERATION TO PRESERVE DATA RELIABILITY

CROSS-REFERENCE TO RELATED APPLICATION(S)

This application is a Continuation of U.S. patent application Ser. No. 17/503,197 filed on Oct. 15, 2021, now Allowed, which claims priority under 35 U.S.C. § 119 to Korean Patent Application No. 10-2020-0181181, filed on Dec. 22, 2020, in the Korean Intellectual Property Office, the disclosure of each of which is incorporated by reference herein in its entirety.

BACKGROUND

The present disclosure relates to a memory device, and more particularly, to a memory device including a three-dimensional memory cell array for performing an erase operation in a sub-block unit.

Research has been conducted into a semiconductor memory device having a three-dimensional array structure to improve an integration degree of a semiconductor memory device, and technology for performing a memory operation in a sub-block unit is suggested to effectively manage memory blocks that are greater than those in an existing two-dimensional array structure. Recently, semiconductor memory devices for supporting a partial erase operation of performing an erase operation in a sub-block unit has been suggested.

Boosting channels of sub-blocks that are erase targets with an erase voltage may be interrupted by other sub-blocks, and furthermore, data stored in other sub-blocks may deteriorate because of the erase voltage, which causes the degradation in the data reliability.

SUMMARY

The present disclosure provides a memory device having a three-dimensional memory cell array and a memory device capable of securing the data reliability by performing an effective erase operation based on positions of sub-blocks.

According to an aspect of the inventive concept, there is provided a memory device including a memory block including a first sub-block and a second sub-block that are connected between a common source line and a plurality of bit lines and vertically stacked, and a control circuit configured to select any one of the common source line and the plurality of bit lines as a transmission path of an erase voltage based on positions of the first sub-block and the second sub-block, and perform erase operations on the first sub-block and the second sub-block in units of sub-blocks.

According to another aspect of the inventive concept, there is provided a memory device including a lower chip including a peripheral circuit region, and a first upper chip stacked on the lower chip, connected to the lower chip according to a bonding method, and including a first cell region, wherein the first cell region includes: a first metal layer formed adjacent to the lower chip and connected to a plurality of first bit lines; a first substrate formed at a higher level than the first metal layer and having a lower surface on which a first common source line is formed; and at least two first sub-blocks connected between the plurality of first bit lines and the first common source line and vertically stacked, and the peripheral circuit region includes a control circuit configured to select any one of the plurality of first bit lines and the first common source line as a transmission path of an erase voltage based on positions of the at least two first sub-blocks, and perform an erase operation on the at least two first sub-blocks.

According to another aspect of the inventive concept, there is provided a memory device including a lower chip including a peripheral circuit region, and a first upper chip stacked on the lower chip, connected to the lower chip according to a bonding method, and including a first cell region, a second upper chip stacked on the first upper chip, connected to the first upper chip according to the bonding method, and including a second cell region, wherein the first cell region includes: a first substrate adjacent to the second upper chip and having a lower surface on which a first common source line is formed; a first metal layer adjacent to the lower chip and connected to the plurality of first bit lines; and a first sub-block including a plurality of first memory cells vertically stacked, the second cell region includes: a second substrate having a lower surface on which a second common source line is formed; a second metal layer adjacent to the first upper chip and connected to a plurality of second bit lines; and a second sub-block including a plurality of second memory cells vertically stacked, and a direction, in which a channel of the first sub-block is boosted by the erase voltage during an erase operation on the first sub-block, is different from a direction, in which a channel of the second sub-block is boosted by the erase voltage during an erase operation on the second sub-block.

BRIEF DESCRIPTION OF THE DRAWINGS

Embodiments of the present disclosure will be more clearly understood from the following detailed description taken in conjunction with the accompanying drawings in which.

DETAILED DESCRIPTION OF THE EMBODIMENTS

Hereinafter, one or more embodiments of the present disclosure will be described in detail with reference to the attached drawings.

Hereinafter, one or more embodiments of the present disclosure may be described by referencing a NAND flash memory. However, the spirit of the inventive concept is not limited to the NAND flash memory. The spirit of the inventive concept may be applied to various non-volatile memory devices such as Electrically Erasable and Programmable ROM (EEPROM), a NOR flash memory device, Phase-change RAM (PRAM), Magnetic RAM (MRAM), Resistive RAM (RRAM), and Ferroelectric RAM (FRAM).

Figure 1:
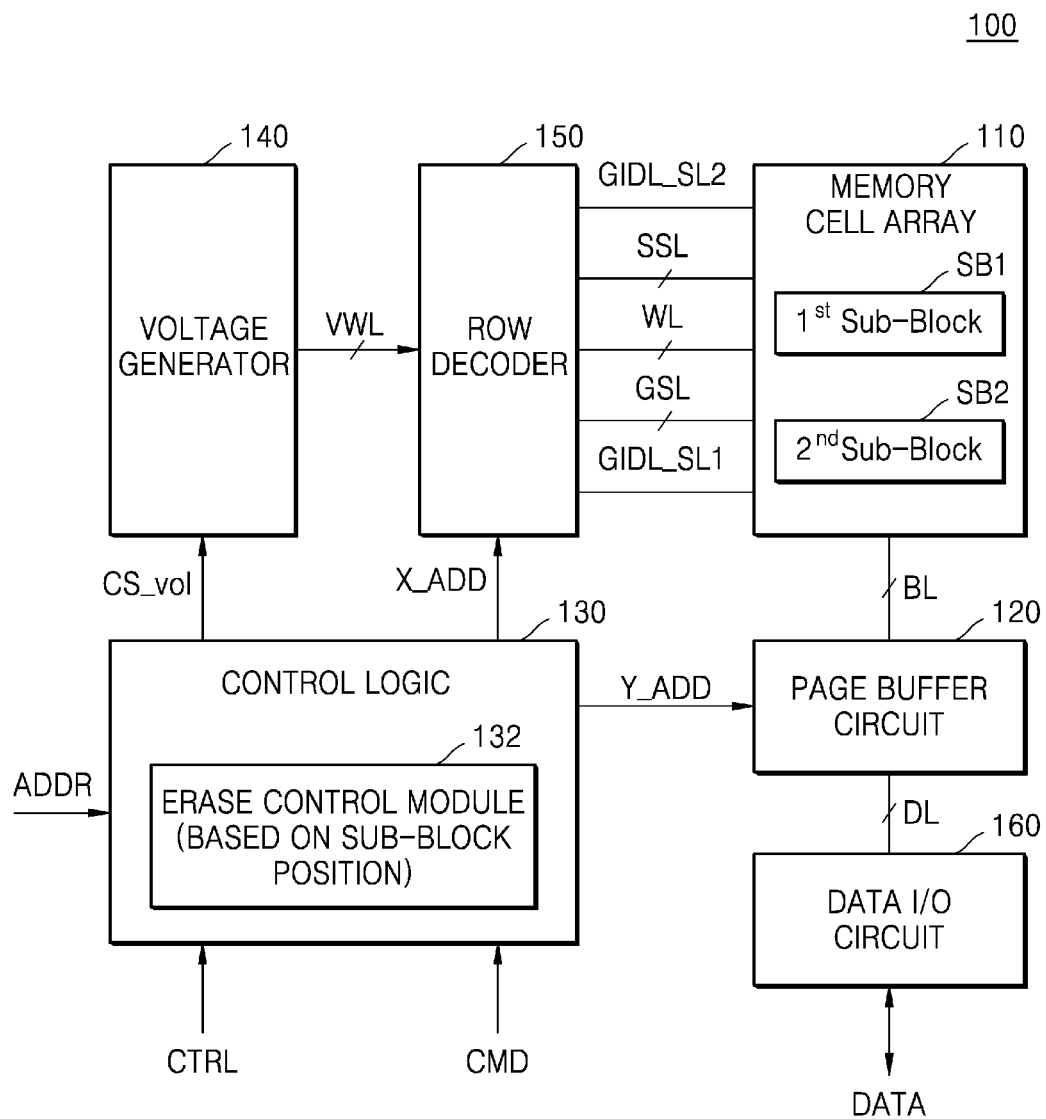
FIG. 1 is a block diagram of a memory device according to an example embodiment.

FIG. 1 is a block diagram of a memory device 100 according to an example embodiment.

Referring to FIG. 1, the memory device 100 may include a memory cell array 110, a page buffer circuit 120, a control logic 130, a voltage generator 140, a row decoder 150, and a data input/output circuit 160. Hereinafter, the control logic 130 may be referred to as a control circuit. The control logic 130 may include an erase control module 132 for controlling an erase operation, according to example embodiments described below. Although not illustrated in FIG. 1, the memory device 100 may further include various functional blocks related to a memory operation. The erase control module 132 may be realized as a hardware logic, a software logic, or a hardware/software compound logic. The erase control module 132 may also be realized as one or more logic circuits.

The memory cell array 110 may include cell strings (or strings) arranged on a substrate in row and column directions. Each cell string may include memory cells stacked in a direction perpendicular to the substrate. That is, the memory cells may be stacked in the direction perpendicular to the substrate and form a three-dimensional structure. Each memory cell may be, for example, a single-level cell, a multi-level cell, a triple-level cell, a quadruple-level cell, or the like. The spirit of the inventive concept may be flexibly applied to various cell types of the memory cells. One memory block of the memory cell array 110 may include a first sub-block SB1 and a second sub-block SB2. Hereinafter, a sub-block may be a memory unit in which memory cells included in a memory block are logically or physically divided, and may be defined as a certain unit in which a partial erase operation is available in the memory block. The control logic 130 may operate the first sub-block SB1 and the second sub-block SB2 in one memory block.

In an example embodiment, cell types of the first sub-block SB1 and the second sub-block SB2 may be identical to or different from each other. Also, the number of memory cells included in the first sub-block SB1 may be identical to or different from the number of memory cells included in the second sub-block SB2. In some embodiments, the number of word lines connected to the first sub-block SB1 may be identical to or different from the number of memory cells included in the second sub-block SB2.

The memory cells of the memory cell array 110 may be connected to the row decoder 150 through word lines WL, string selection lines SSL, ground selection lines GSL, bit lines BL, a first Gate Induced Drain Leakage (GIDL) selection line GIDL_SL1, and a second GIDL selection line GIDL_SL2 and may be connected to the page buffer circuit 120 through the bit lines BL. Voltages having controlled levels may be applied to the first GIDL selection line GIDL_SL1 and the second GIDL selection line GIDL_SL2 so that an operation according to example embodiments may be performed during the erase operation. Voltages having fixed levels may be applied during operations other than the erase operation.

The page buffer circuit 120 may temporarily store data to be programmed in the memory cell array 110 and data that is read from the memory cell array 110. The page buffer circuit 120 may include page buffers (or latches). For example, each page buffer may include latches respectively corresponding to the bit lines BL and may store data in a page unit. The page buffer circuit 120 may include a sensing latch, and the sensing latch may include sensing latches respectively corresponding to the bit lines BL. Also, each sensing latch may be connected to a sensing node at which data is detected through a corresponding bit line.

The control logic 130 may control all operations of the memory device 100. For example, the control logic 130 may program data in the memory cell array 110 based on a command CMD, an address ADDR, and a control signal CTRL received from a memory controller (not illustrated), may read the data from the memory cell array 110, or may output various internal control signals for erasing the data stored in the memory cell array 110.

The internal control signals output from the control logic 130 may be provided to the page buffer circuit 120, the voltage generator 140, and the row decoder 150. In detail, the control logic 130 may provide a voltage control signal CS_vol to the voltage generator 140. The voltage generator 140 may include one or more pumps (not illustrated) and may generate voltages VWL having different levels according to a pumping operation according to the voltage control signal CS_vol. Also, the control logic 130 may provide a row address X_ADD to the row decoder 150 and a column address Y_ADD to the page buffer circuit 120. Hereinafter, an operation of the erase control module 132 is described, and the control logic 130 may generate internal control signals regarding the operation of the erase control module 132 and output the internal control signals to functional blocks of the memory device 100, respectively. Also, the operation of the erase control module 132 may be defined as an operation of the control logic 130.

In an example embodiment, the erase control module 132 may select any one of the bit lines BL and a common source line (not illustrated) as a transmission path of an erase voltage, based on positions of the first and second sub-blocks SB1 and SB2, and the erase control module 132 may perform the erase operations on the first and second sub-blocks SB1 and SB2 in sub-block units. Hereinafter, for better understanding, it is assumed that the second sub-block SB2 is stacked on the first sub-block SB1 and thus is closer to the bit lines BL than the first sub-block SB1.

In an example embodiment, the erase control module 132 may select the common source line (not illustrated) as a transmission path of the erase voltage during the erase operation. Accordingly, because of the erase voltage applied through the common source line (not illustrated), channels of the first sub-block SB1 and the second sub-block SB2 may be sequentially boosted.

In an example embodiment, the erase control module 132 may select the bit lines BL as transmission paths of the erase voltage, during the erase operation performed on the second sub-block SB2. Accordingly, because of the erase voltage applied through the bit lines BL, the channels of the second sub-block SB2 and the first sub-block SB1 may be sequentially boosted.

In some embodiments, the erase control module 132 may select all of the common source line (not illustrated) and the bit lines BL as the transmission paths of the erase voltage, during the erase operation performed on at least one of the first sub-block SB1 and the second sub-block SB2. Accordingly, because of the erase voltage applied through the bit lines BL and the common source line (not illustrated), the channels of the first sub-block SB1 and the second sub-block SB2 may be boosted.

As described above, the erase control module 132 may variously select the transmission paths of the erase voltage according to whether a position of a target sub-block that is an erase target, that is, whether the target sub-block is adjacent to the common source line (not illustrated) or the bit line BL.

However, the illustration of FIG. 1 is merely an example, and one or more embodiments are not limited thereto. The memory cell array 110 may include more sub-blocks in addition to the first sub-block SB1 and the second sub-block SB2, and the erase control module 132 may select the transmission path of the erase voltage based on the positions of the sub-blocks and perform the erase operations in the sub-block units.

In an example embodiment, the memory device 100 may have any one of stack structures, a Cell Over Periphery (COP) structure, and a bonding structure, and erase methods according to example embodiments may be applied to sub-blocks included in respective embodiments. The embodiment regarding the stack structures will be described in detail with reference to FIG. 2C, the embodiment regarding the COP structure will be described in detail with reference to FIG. 2D, and the embodiment regarding the bonding structure will be described in detail with reference to FIGS. 14 and 15A to 15D.

Figure 2A:
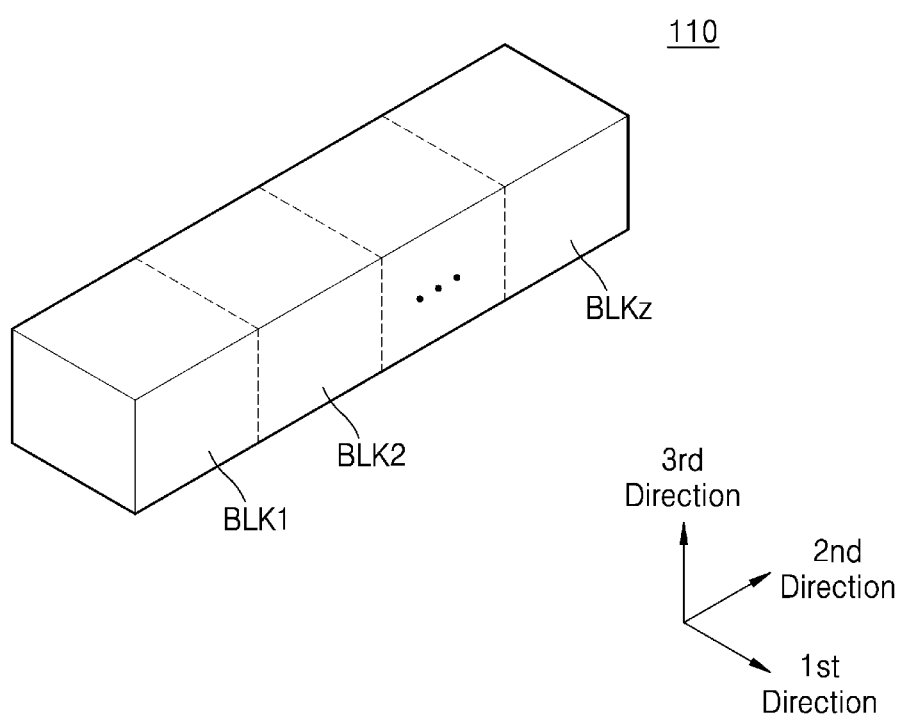
FIG. 2A is a diagram of a memory cell array of FIG. 1.
Figure 2B:
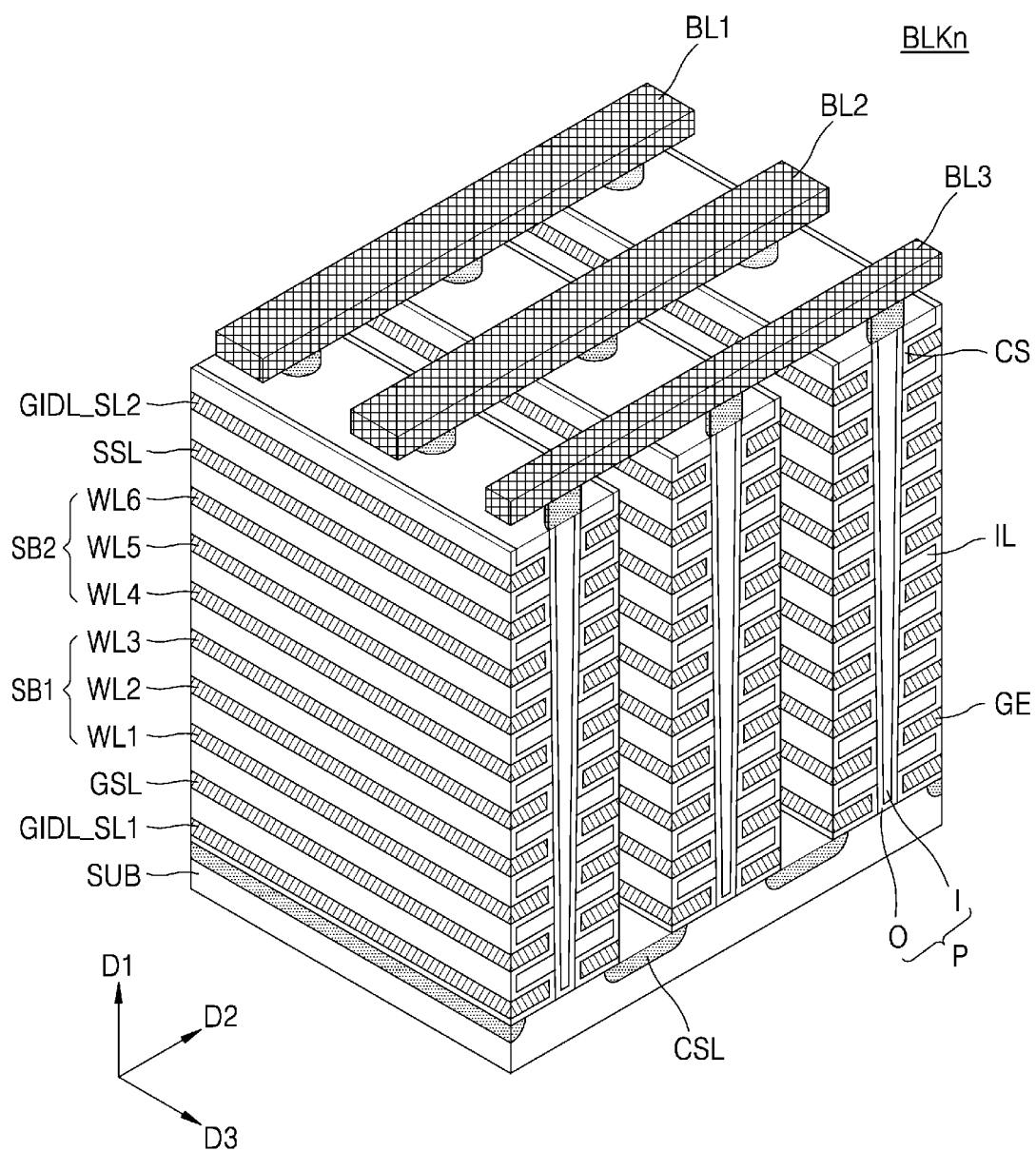
FIGS. 2B and 2C are diagrams for explaining a configuration of one of memory blocks of FIG. 2A.
Figure 2C:
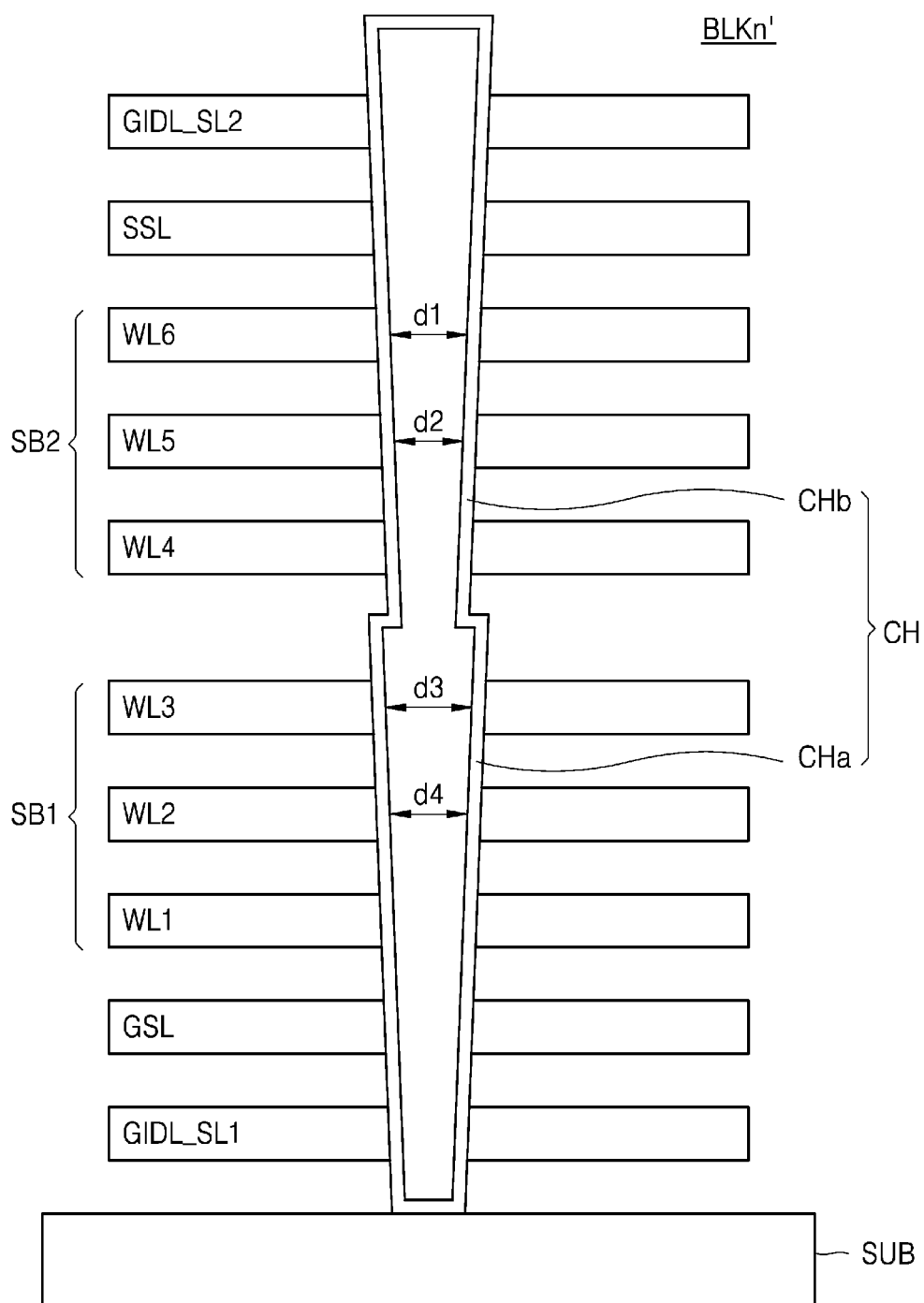
Figure 2D:
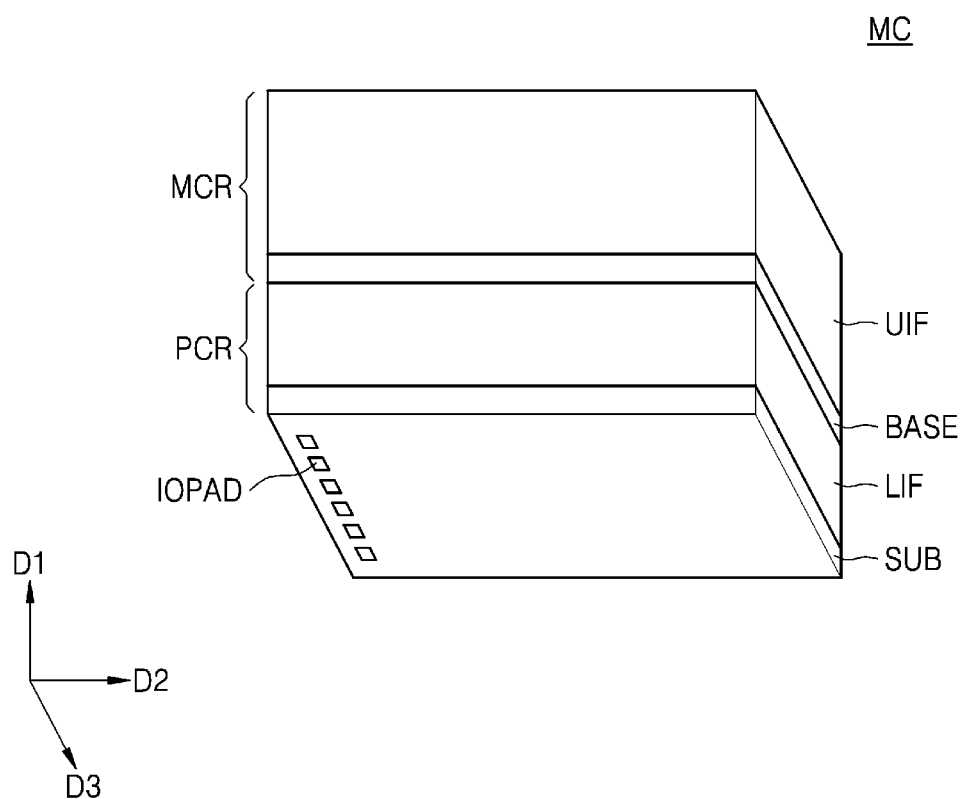
FIG. 2D is a diagram for explaining a memory device having a COP structure, according to example embodiments.

FIG. 2A is a diagram of a memory cell array 110 of FIG. 1, FIGS. 2B and 2C are diagrams for explaining a configuration of one of memory blocks of FIG. 2A, and FIG. 2D is a diagram for explaining a memory device having a COP structure, according to example embodiments.

Referring to FIGS. 1 and 2A, the memory cell array 110 may include memory blocks BLK1 to BLKz (z is a natural number greater than 1). The memory blocks BLK1 to BLKz may each have a three-dimensional structure (a vertical structure). For example, each of the memory blocks BLK1 to BLKz may include structures extending in first to third directions. Each of the memory blocks BLK1 to BLKz may include cell strings (not illustrated) extending in the second direction. The cell strings (not illustrated) may be apart from each other in the first and third directions. The cell strings (not illustrated) of one memory block are connected to the bit lines BL, the string selection lines SSL, the word lines WL, one or more ground selection lines GSL, and the common source line (not illustrated). The cell strings (not illustrated) of the memory blocks BLK1 to BLKz may share the bit lines BL. For example, the bit lines BL may extend in the second direction and may be shared by the memory blocks BLK1 to BLKz.

The memory blocks BLK1 to BLKz may be selected by the row decoder 150 illustrated in FIG. 1. For example, the row decoder 150 may select a memory block, which corresponds to the received address ADDR, from among the memory blocks BLK1 to BLKz. A program operation and a read operation may be performed on the selected memory block. Also, the erase operation according to example embodiments may be performed on a selected sub-block included in the selected memory block.

Referring further to FIG. 2B, a memory block BLKn from among the memory blocks BLK1 to BLKz of FIG. 2A is formed in a direction perpendicular to a substrate SUB. A common source line CSL is arranged on the substrate SUB, and gate electrodes GE and insulation layers IL are alternately stacked on the substrate SUB. Also, a charge storage layer CS may be formed between the gate electrode GE and the insulation layer IL.

When the gate electrodes GE and the insulation layers IL, which are alternately stacked, are vertically patterned, a pillar P having a V shape is formed. The pillar P is connected to the substrate SUB by penetrating the gate electrodes GE and the insulation layers IL. An outer portion O of the pillar P may include a semiconductor material and function as a channel, and an internal portion I of the pillar P may include an insulation material such as silicon oxide.

The gate electrodes GE of the memory block BLKn may include the first GIDL selection line GIDL_SL1, the ground selection line GSL, first to sixth word lines WL1 to WL6, the string selection line SSL, and the second GIDL selection line GIDL_SL2. The pillar P of the memory block BLKn may be connected to the bit lines BL1 to BL3. Also, memory cells connected to the first to third word lines WL1 to WL3 may form the first sub-block SB1, and memory cells connected to fourth to sixth word lines WL4 to WL6 may form the second sub-block SB2. The memory block BLKn may be applied to the memory blocks BLK1 to BLKz of FIG. 2A. Hereinafter, for convenience, it is illustrated that a sub-block includes word lines and memory cells connected thereto. However, the sub-block may be defined to include at least one of GIDL selection lines, transistors connected to the GIDL selection lines, ground selection lines, transistors connected to the ground selection lines, string selection lines, and transistors connected to the string selection lines.

However, the memory block BLKn of FIG. 2B is merely an example for convenience of explanation, and one or more embodiments are not limited thereto. It may be understood that the spirit of the inventive concept may be applied to various embodiments of the memory block BLKn.

FIG. 2C illustrates sub-blocks SB1 and SB2 in a memory block BLKn' formed according to a different method from that applied to the memory block BLKn. Referring to FIG. 2C, channels CH of the memory block BLKn' may include a lower channel CHa and an upper channel CHb. The lower channel CHa may be positioned between the upper channel CHb and the substrate SUB. For example, the lower channel CHa may be formed through an etching process and a polysilicon deposition process before the upper channel CHb is formed. After the lower channel CHa is formed, the upper channel CHb may be formed on the lower channel CHa through an additional etching process and the polysilicon deposition process. In this case, the memory cells corresponding to the lower channel CHa may be defined as the first sub-block SB1, and the memory cells corresponding to the upper channel CHb may be defined as the second sub-block SB2.

Channel widths of the lower channel CHa and the upper channel CHb may have the same profile. For example, a diameter d1 of the upper channel CHb corresponding to the sixth word line WL6 may be substantially the same as or similar to a diameter d3 of the lower channel CHa corresponding to the third word line WL3. Also, a diameter d2 of the upper channel CHb corresponding to the fifth word line WL5 may be substantially the same or similar to a diameter d4 of the lower channel CHa corresponding to the second word line WL2. Also, a diameter of the lower channel CHa of the first sub-block SB1 at a point, at which the first sub-block SB1 contacts the second sub-block SB2, may be greater than a diameter of the upper channel CHb of the second sub-block SB2.

However, the memory block BLKn' of FIG. 2C is merely an example. More channels stacks may be formed as more channels are formed in stages, and the memory block BLKn' may include sub-blocks respectively corresponding to the channels.

Referring to FIG. 2D, a memory device MC according to an example embodiment may include a peripheral circuit region PCR, where a peripheral circuit is formed, a memory cell region MCR, and input/output pads IOPAD. The peripheral circuit region PCR may include a semiconductor substrate SUB, a peripheral circuit (not illustrated) formed on an upper surface of the semiconductor substrate SUB, and a lower insulation layer LIF covering the peripheral circuit. The memory cell region MCR may include a base layer BASE formed on an upper surface of the lower insulation layer LIF, a memory cell array (not illustrated) formed on an upper surface of the base layer BASE, and an upper insulation layer UIF covering the memory cell array. The input/output pads IOPAD may be formed on a lower surface of the semiconductor substrate SUB. In the memory device MC, the peripheral circuit may be formed on the semiconductor substrate SUB, and a size of the memory device MC may decrease by employing the COP structure in which the memory cell array is stacked on the peripheral circuit.

At least one memory block, which includes the sub-blocks on which the erase operation according to example embodiments is performed, may be formed in the memory cell region MCR. Also, to select the transmission path of the erase voltage, erase transistors controlled to be on/off may be formed in the peripheral circuit region PCR.

Figure 3:
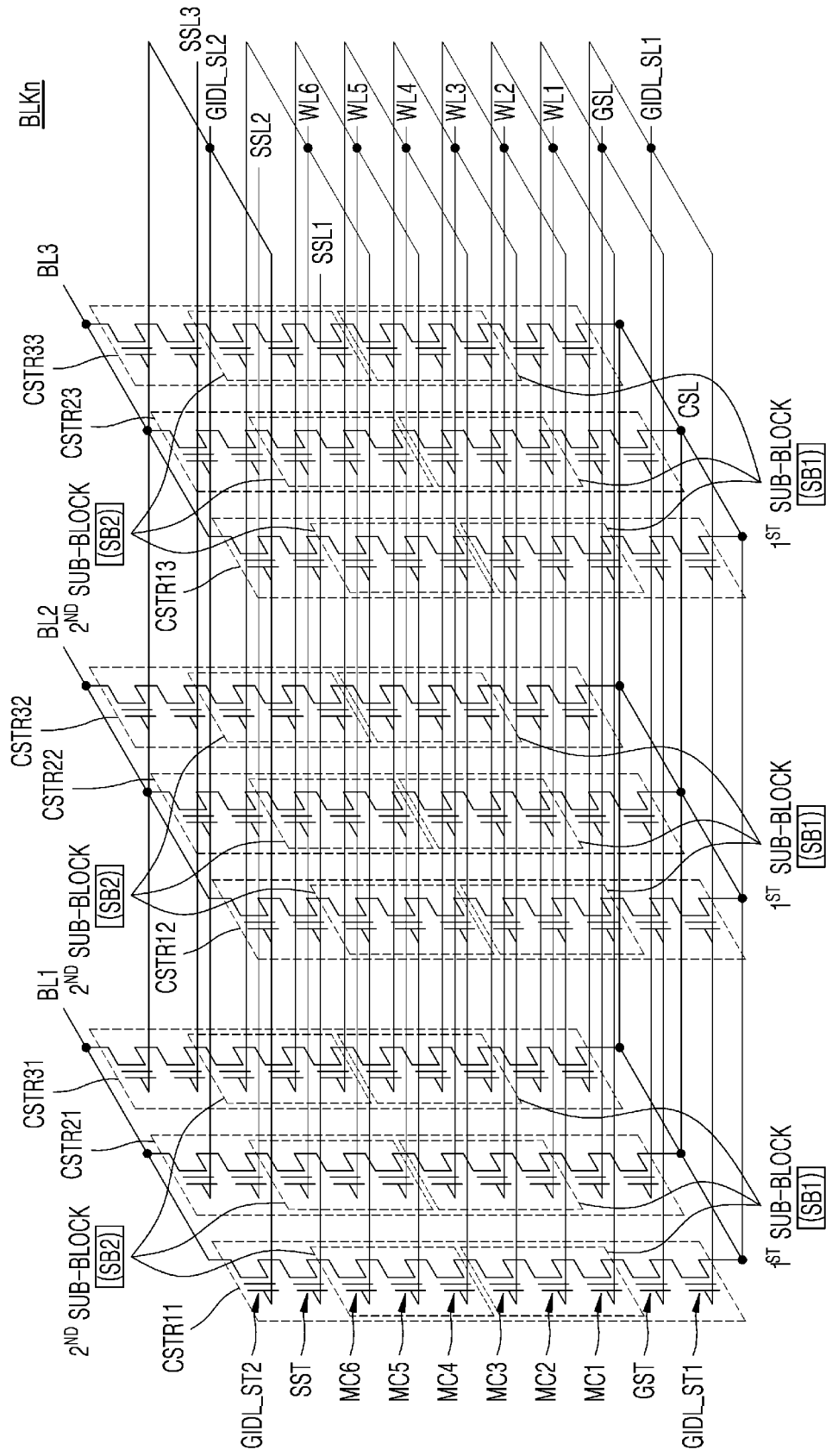
FIG. 3 is a circuit diagram of the memory block of FIG. 2B.

FIG. 3 is a circuit diagram of the memory block BLKn of FIG. 2B.

Referring to FIG. 3, the memory block BLKn may be a vertical NAND flash memory and may include cell strings CSTR11, CSTR21, CSTR31, CSTR12, CSTR22, CSTR32, CSTR13, CSTR23 and CSTR33, the first to sixth word lines WL1 to WL6, the bit lines BL1 to BL3, the ground selection line GSL, the string selection lines SSL1 to SSL3, the common source line CSL, the first GIDL selection line GIDL_SL1, and the second GIDL selection line GIDL_SL2. Here, the number of cell strings, the number of word lines, the number of bit lines, the number of ground selection lines, the number of string selection lines, the number of first and second GIDL selection lines, and connections between such lines may vary according to example embodiments.

The cell strings CSTR11, CSTR21, CSTR31, CSTR12, CSTR22, CSTR32, CSTR13, CSTR23 and CSTR33 may be connected between the bit lines BL1 to BL3 and the common source line CSL. Each cell string (e.g., the cell string CSTR11) may include first and second GIDL selection transistors GIDL_ST1 and GIDL_ST2, a string selection transistor SST, first to sixth memory cells MC1 to MC6, and a ground selection transistor GST that are connected in series. The first to third memory cells MC1 to MC3 may form the first sub-block SB1, and the fourth to sixth memory cells MC4 to MC6 may form the second sub-block SB2. The memory device may perform a partial erase operation on each of the first sub-block SB1 and the second sub-block SB2. FIG. 3 illustrates that one memory block BLKn includes two sub-blocks, e.g., the first sub-block SB1 and the second sub-block SB2, but this is merely an example. The memory block BLKn may include more sub-blocks than two.

In an example embodiment, the first and second GIDL selection transistors GIDL_ST1 and GIDL_ST2 may have a configuration for intentionally causing GIDL during the erase operation, and the erase voltage may be effectively transmitted to the channels of the first and second sub-blocks SB1 and SB2 through the first and second GIDL selection transistors GIDL_ST1 and GIDL_ST2.

The string selection transistor SST may be connected to the string selection lines SSL1 to SSL3. The memory cells MC1 to MC6 may be respectively connected to the first to sixth word lines WL1 to WL6. The ground selection transistor GST may be connected to the ground selection line GSL. In an example embodiment, in the first GIDL selection transistor GIDL_ST1, a gate may be connected to the first GIDL selection line GIDL_SL1, and a source may be connected to the common source line CSL. In the second GIDL selection transistor GIDL_ST2, a gate may be connected to the second GIDL selection line GIDL_SL2, and a drain may be connected to the corresponding bit lines BL1 to BL3.

The word lines (e.g., the word line WL1) having the same height may be commonly connected, and the string selection lines SSL1 to SSL3 may be separated. When the memory cells connected to the first word line WL1 and included in the cell strings CSTR11, CSTR12, and CSTR13 are programmed, the first word line WL1 and the first string selection line SSL1 may be selected.

The memory device according to an embodiment may select the transmission path of the erase voltage based on the positions of the first and second sub-blocks SB1 and SB2 and may perform the erase operation by using the selected transmission path.

Figure 4:
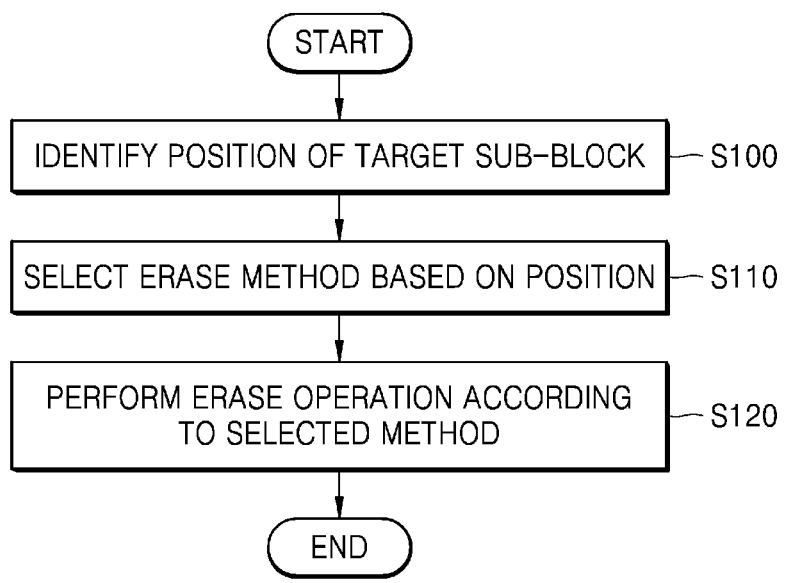
FIG. 4 is a flowchart of an operation method of a memory device, according to an example embodiment.

FIG. 4 is a flowchart of an operation method of a memory device, according to an example embodiment.

Referring to FIG. 4, in operation S100, the memory device may identify a position of a target sub-block that is an erase target. For example, the memory device may identify whether the target sub-block is adjacent to a bit line or a common source line. As another example, the memory device may identify whether the target sub-block is adjacent to a string selection line or a ground selection line. In some embodiments, the memory device may identify the position of the target sub-block by referencing position information regarding each sub-block that is stored in advance. In operation S110, the memory device may select an erase method based on the position of the target sub-block. In operation S120, the memory device may perform the erase operation on the target sub-block according to the selected erase method. For example, when the target sub-block is adjacent to the bit line, the memory device may select the bit line as the transmission path of the erase voltage and may perform the erase operation on the target sub-block. When the target sub-block is adjacent to the common source line, the memory device may select the common source line as the transmission path of the erase voltage and may perform the erase operation on the target sub-block. In some embodiments, the memory device may select the bit line and the common source line as the transmission paths of the erase voltage regardless of the position of the target sub-block and may perform the erase operation on the target sub-block.

Figure 5:
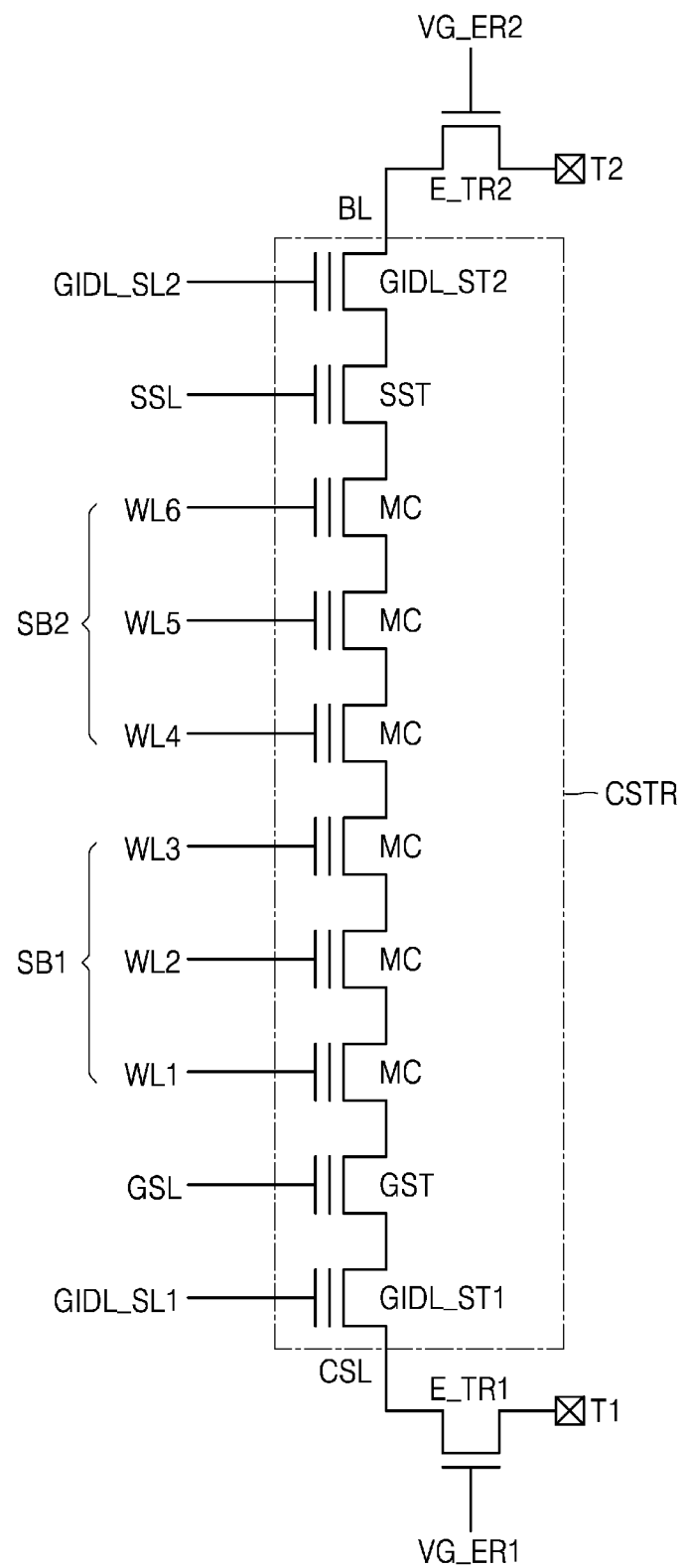
FIG. 5 is a diagram of a cell string included in a memory block, according to an example embodiment.

FIG. 5 is a diagram of a cell string CSTR included in a memory block, according to an example embodiment.

Referring to FIG. 5, the cell string CSTR may include the first GIDL selection transistor GIDL_ST1 and the ground selection transistor GST for controlling an electrical connection between the common source line CSL and the cell string CSTR, may include the second GIDL selection transistor GIDL_ST2 and the string selection transistor SST for controlling an electrical connection between the bit line BL and the cell string CSTR, and may include the memory cells MC. In detail, the first GIDL transistor GIDL_ST1 may be coupled between the common source line CSL and the ground selection transistor GST, and the second GIDL transistor GIDL_ST2 may be coupled to the bit line BL and the string selection transistor SST.

The cell string CSTR may be coupled to a first erase transistor E_TR1 that is controlled to be on/off, according to a first gate voltage VG_ER1 to selectively apply the erase voltage to the common source line CSL. The first erase transistor E_TR1 may be coupled to a first terminal T1 to which the erase voltage is applied. The cell string CSTR may be coupled to a second erase transistor E_TR2 that is controlled to be on/off, according to a second gate voltage VG_ER2 to selectively apply the erase voltage to the bit line BL. The second erase transistor E_TR2 may be coupled to a second terminal T2 to which the erase voltage is applied.

In some embodiments, when the memory block including the cell string CSTR has a COP structure, the memory block may be stacked on a peripheral circuit. For example, in the peripheral circuit, the page buffer circuit 120, the control logic 130, the voltage generator 140, the row decoder 150, and the data input/output circuit 160 of FIG. 1 may be formed. Also, the first and second erase transistors E_TR1 and E_TR2 may be formed in a region (hereinafter, referred to as a peripheral circuit region) where the peripheral circuit is formed. Detailed descriptions thereof will be provided below.

Arrangements of the first and second erase transistors E_TR1 and E_TR2 of FIG. 5 are merely examples, and one or more embodiments are not limited thereto. Various arrangements may be applied to the cell string CSTR to enable the selection of at least one of the common source line CSL and the bit line BL as the transmission path of the erase voltage.

Figure 6A:
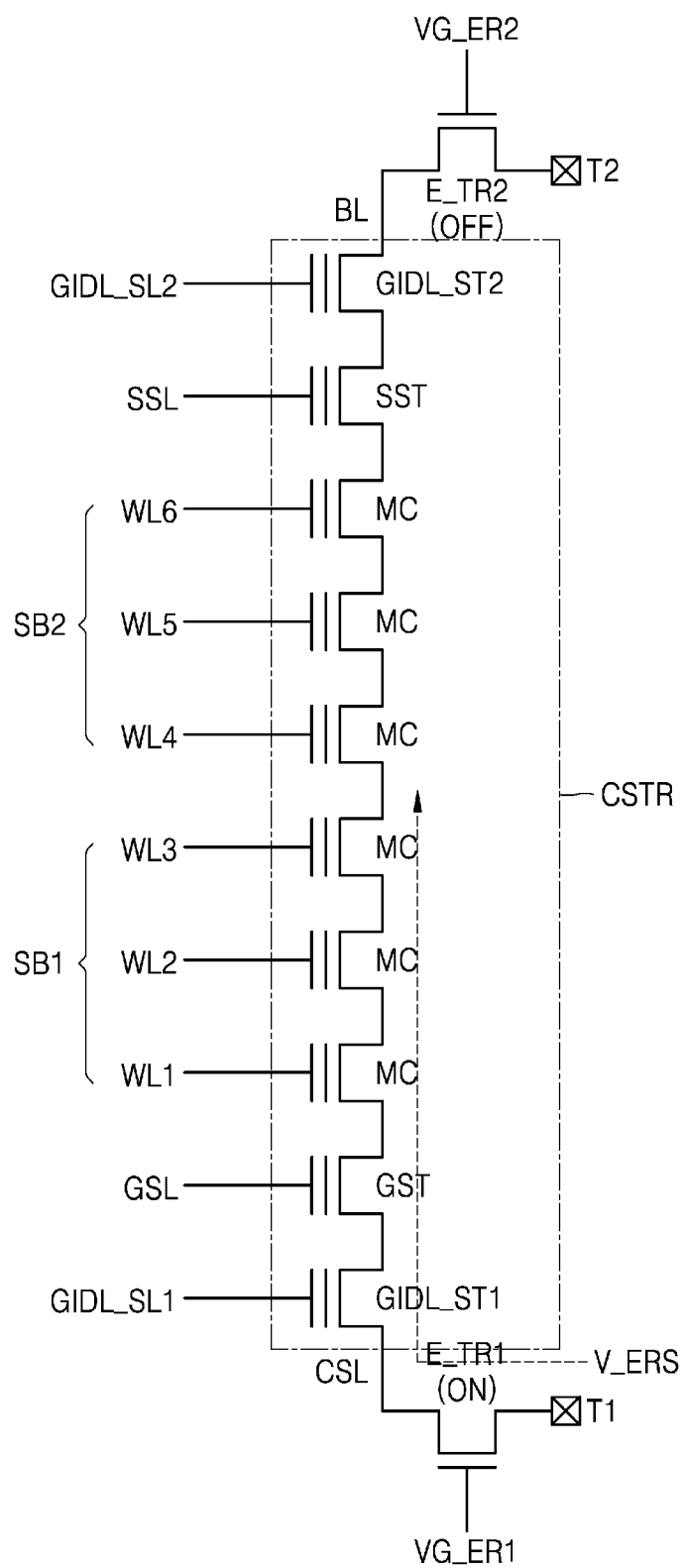
FIGS. 6A and 6B are diagrams for explaining an erase operation performed on a first sub-block in the cell string of FIG. 5 according to example embodiments.
Figure 6B:
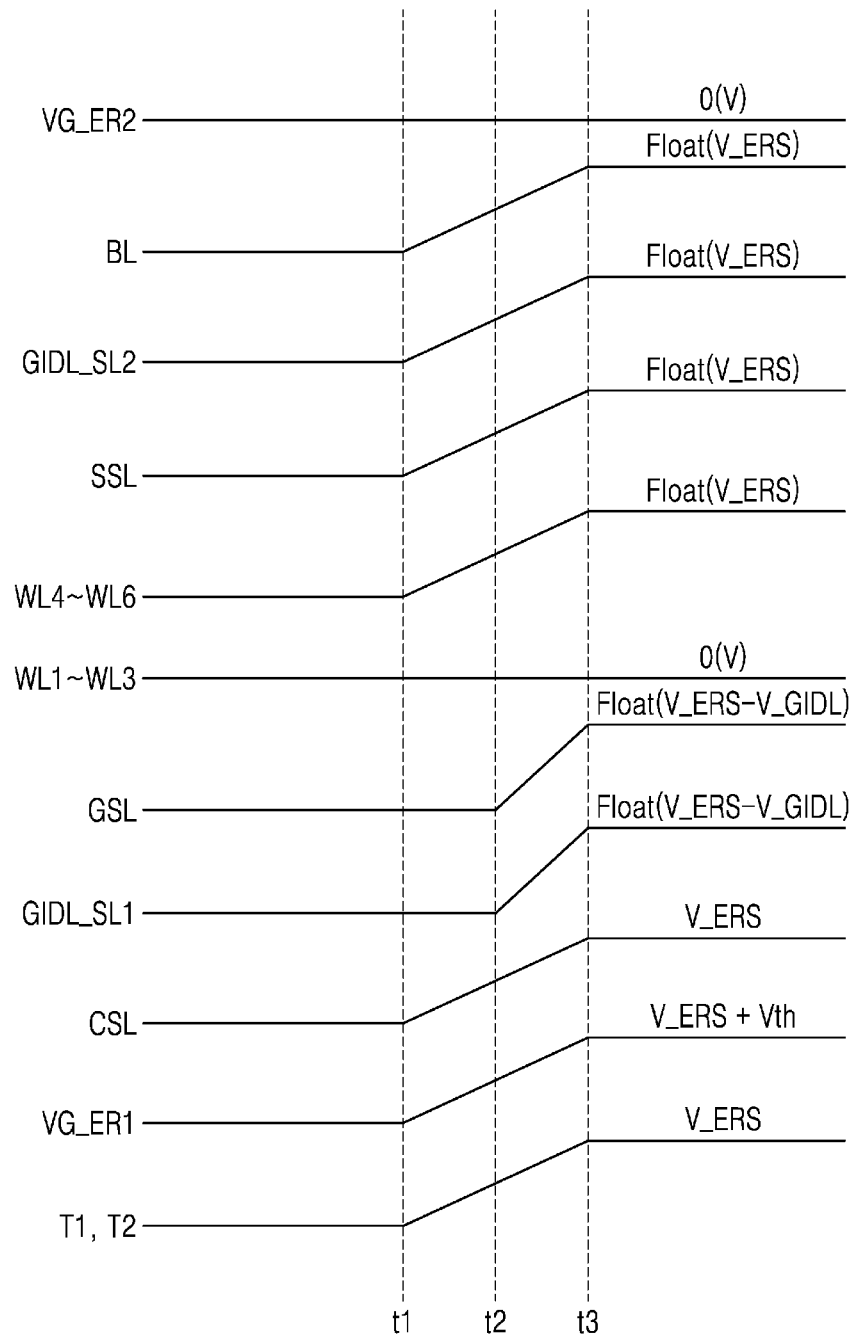

FIGS. 6A and 6B are diagrams for explaining an erase operation performed on the first sub-block SB1 in the cell string CSTR of FIG. 5 according to example embodiments.

Referring to FIG. 6A, when the erase operation is performed on the first sub-block SB1, the common source line CSL may be selected as a transmission path of an erase voltage V_ERS, based on the position of the first sub-block SB1 that is adjacent to the common source line CSL. A detailed operation will be described with reference further to FIG. 6B.

Referring further to FIG. 6B, the erase voltage V_ERS may be applied to the first and second terminals T1 and T2 from a first time point t1. The first gate voltage VG_ER1 may be applied to a gate of the first erase transistor E_TR1 from the first time point t1, wherein the first gate voltage VG_ER1 may be increased from 0 V (or a low level) to a level from the first time point t1 to third time point t3, at which the erase voltage V_ERS is added to a certain threshold voltage $V_{th}$. Thus, the first erase transistor E_TR1 may be turned on. For example, the erase voltage V_ERS may be about 18 V, and the threshold voltage $V_{th}$ may be about 3 V. A second gate voltage VG_ER2 having a voltage of 0 V (or the low level) may be applied to a gate of the second erase transistor E_TR2, and thus, the second erase transistor E_TR2 may be turned off. The common source line CSL may be selected as the transmission path of the erase voltage V_ERS, and a voltage of the common source line CSL may be increased from 0 V (or the low level) to the level of the erase voltage V_ERS from the first time point t1 to the third time point t3. The voltage of 0 V (or the low level) may be applied to the ground source line GSL and the first GIDL selection line GIDL_SL1 from the first time point t1 to a second time point t2, and the ground source line GSL and the first GIDL selection line GIDL_SL1 may be floated from the second time point t2. Hereinafter, controlling of the ground selection line GSL and the first GIDL selection line GIDL_SL1 to have a floating start timing (the second time point t2), which is later than floating start timings (the first time point t1) of the bit lines BL, the second GIDL selection line GIDL_SL2, the string selection line SSL, and the fourth to sixth word lines WL4 to WL6 is to effectively provide the erase voltage V_ERS to the channel of the second sub-block SB2 by causing a voltage difference between the channel of the first sub-block SB1 and the second sub-block SB2 from the first time point t1 to the second time point t2. The ground source line GSL and the first GIDL selection line GIDL_SL1 may have a floating voltage of which a level is obtained by subtracting the GIDL voltage V_GIDL from the erase voltage V_ERS. The GIDL voltage V_GIDL is generated because of the GIDL from the first GIDL selection transistor GIDL_ST1 and is to effectively provide the erase voltage V_ERS to the channel of the second sub-block SB2 by causing the voltage difference between the channel of the first sub-block SB1 and the second sub-block SB2 even after the third time point t3.

Because the first sub-block SB1 is an erase target sub-block, the voltage of 0 V (or the low level) may be applied to the first to third word lines WL1 to WL3. Because the second sub-block SB2 is not the erase target sub-block, the fourth to sixth word lines WL4 to WL6 may be floated to the erase voltage V_ERS from the first time point t1. Likewise, the string selection line SSL, the second GIDL selection line GIDL_SL2, and the bit line BL may be floated from the erase voltage V_ERS from the first time point t1.

Through the above operation, the channels of the first sub-block SB1 and the second sub-block SB2 may be sequentially boosted to the erase voltage V_ERS in a direction from the common source line CSL to the bit line BL, and the memory cells MC of the first sub-block SB1 may be erased.

An application start timing (the first time point t1), in which the erase voltage is applied to the first and second terminals T1 and T2, may be identical to floating start timings (the first time point t1) of the bit line BL, the second GIDL selection line GIDL_SL2, the string selection line SSL, and the fourth to sixth word lines WL4 to WL6.

Figure 7A:
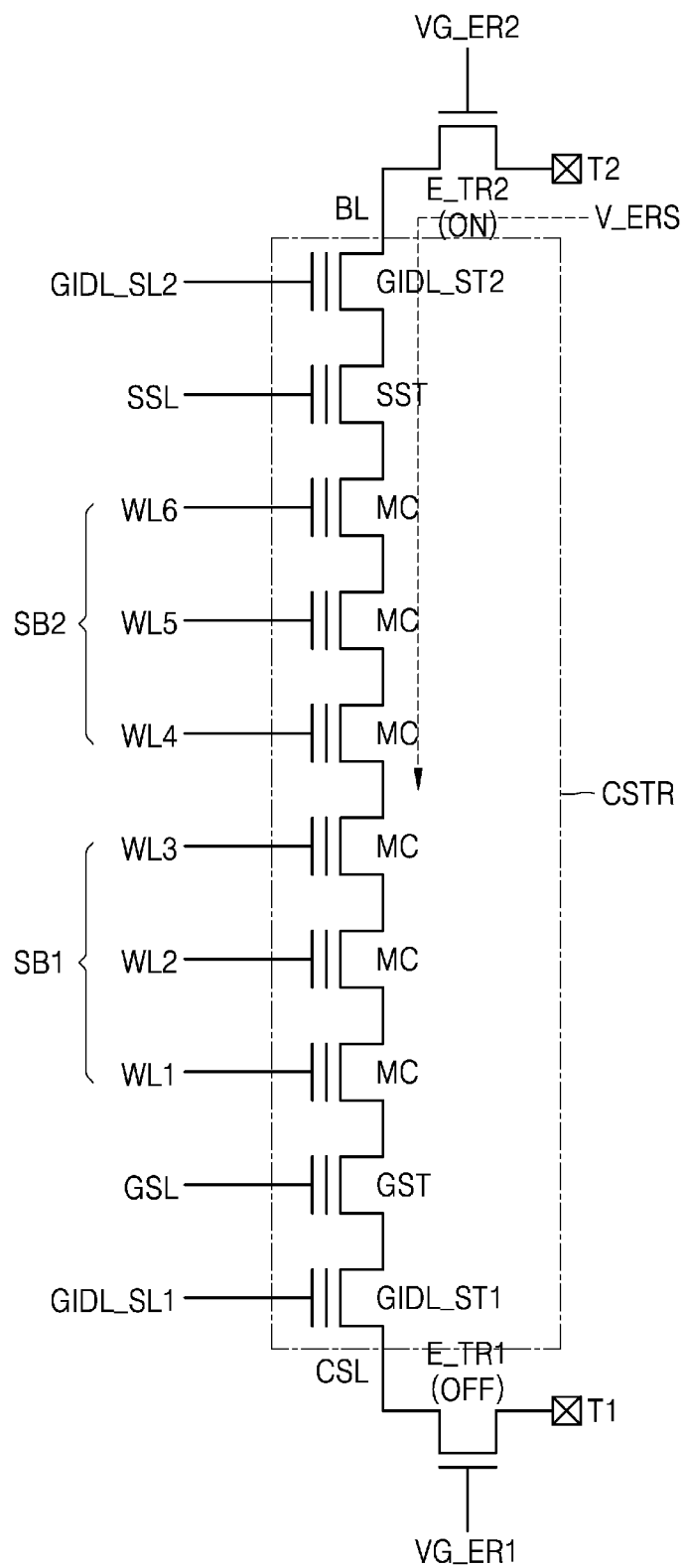
FIGS. 7A and 7B are diagrams for explaining an erase operation performed on a second sub-block in the cell string of FIG. 5 according to example embodiments.
Figure 7B:
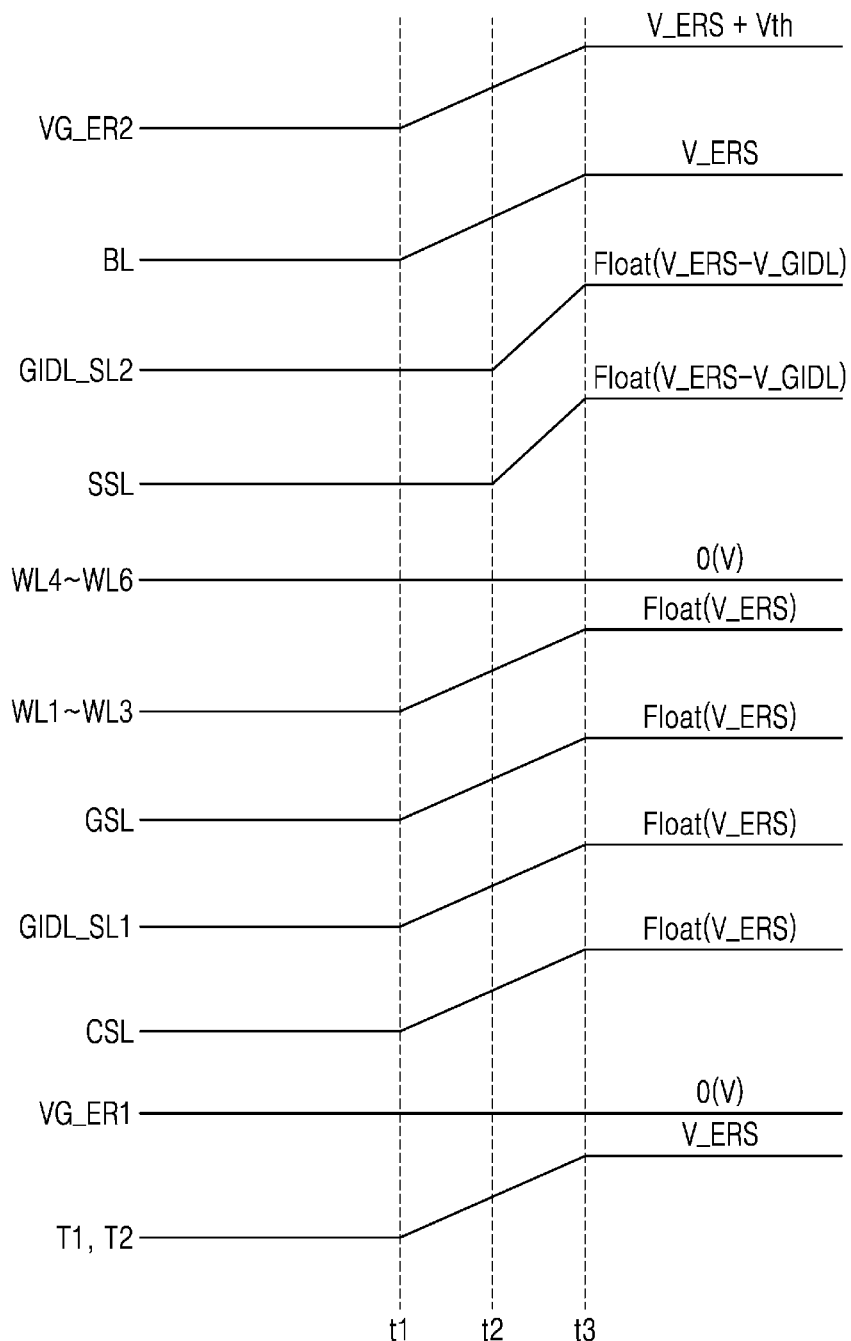

FIGS. 7A and 7B are diagrams for explaining the erase operation performed on the second sub-block SB2 in the cell string CSTR of FIG. 5 according to example embodiments. Hereinafter, comparative examples will be described first before example embodiments of FIGS. 7A and 7B are described. In comparative examples, it is assumed that, when the second sub-block SB2 is erased, the erase voltage V_ERS is transmitted through the common source line CSL, as illustrated in FIGS. 6A and 6B. In comparative examples, when 0 V (or the low level) is applied to the ground selection line GSL and the first GIDL selection line GIDL_SL1 from the first time point t1 to the second time point t2 to effectively transmit the erase voltage V_ERS to the channel of the second sub-block SB2, a voltage difference between the ground selection line GSL and the first GIDL selection line GIDL_SL1 and other lines, to which a voltage increased to be closer to the erase voltage V_ERS is applied, may be relatively great, and thus, charges stored in the memory cells MC of the first sub-block SB1 may be lost. The loss of changes may result in the degradation in the reliability of the data of the memory device, and the embodiments of FIGS. 7A and 7B may be applied to solve the problem stated in comparative examples. Hereinafter, the descriptions provided with reference to FIGS. 6A and 6B are omitted.

Referring to FIG. 7A, when the erase operation is performed on the second sub-block SB2, the bit line BL may be selected as the transmission path of the erase voltage V_ERS, based on the position of the second sub-block SB2 adjacent to the bit line BL. A detailed operation will be described with reference to FIG. 7B.

Referring further to FIG. 7B, the second gate voltage VG_ER2, which is increased from 0 V (or the low level) to a level from the first time point t1 to the third time point t3, at which the erase voltage V_ERS is added to a certain threshold voltage Vth, may be applied to a gate of the second erase transistor E_TR2, and thus, the second erase transistor E_TR2 may be turned on. The first gate voltage VG_ER1 of 0 V (or the low level) may be applied to the gate of the first erase transistor E_TR1, and the first erase transistor E_TR1 may be turned off. The bit line BL may be selected as the transmission path of the erase voltage V_ERS, and the voltage of the bit line BL may be increased from 0 V (or the low level) to the erase voltage V_ERS from the first time point t1 to the third time point t3. The voltage of 0 V (or the low level) may be applied to the string selection line SSL and the second GIDL selection line GIDL_SL2 from the first time point t1 to the second time point t2, and the string selection line SSL and the second GIDL selection line GIDL_SL2 may be floated from the second time point t2. The string selection line SSL and the second GIDL selection line GIDL_SL2 may have the floating voltage having a level obtained by subtracting the GIDL voltage V_GIDL from the erase voltage V_ERS. The GIDL voltage V_GIDL may be generated because of the GIDL from the second GIDL selection transistor GIDL_ST2.

Because the second sub-block SB2 is the erase target sub-block, the voltage of 0 V (or the low level) may be applied to the fourth to sixth word lines WL4 to WL6. Because the first sub-block SB1 is not the erase target sub-block, the first to third word lines WL1 to WL3 may be floated to the erase voltage V_ERS from the first time point t1. Likewise, the ground selection line GSL, the first GIDL selection line GIDL_SL1, and the common source line CSL may be floated to the erase voltage V_ERS from the first time point t1.

Through the above operation, the channels of the second sub-block SB2 and the first sub-block SB1 may be sequentially boosted to the erase voltage V_ERS in a direction from the bit line BL to the common source line CSL, and the memory cells MC of the second sub-block SB2 may be erased.

Figure 8A:
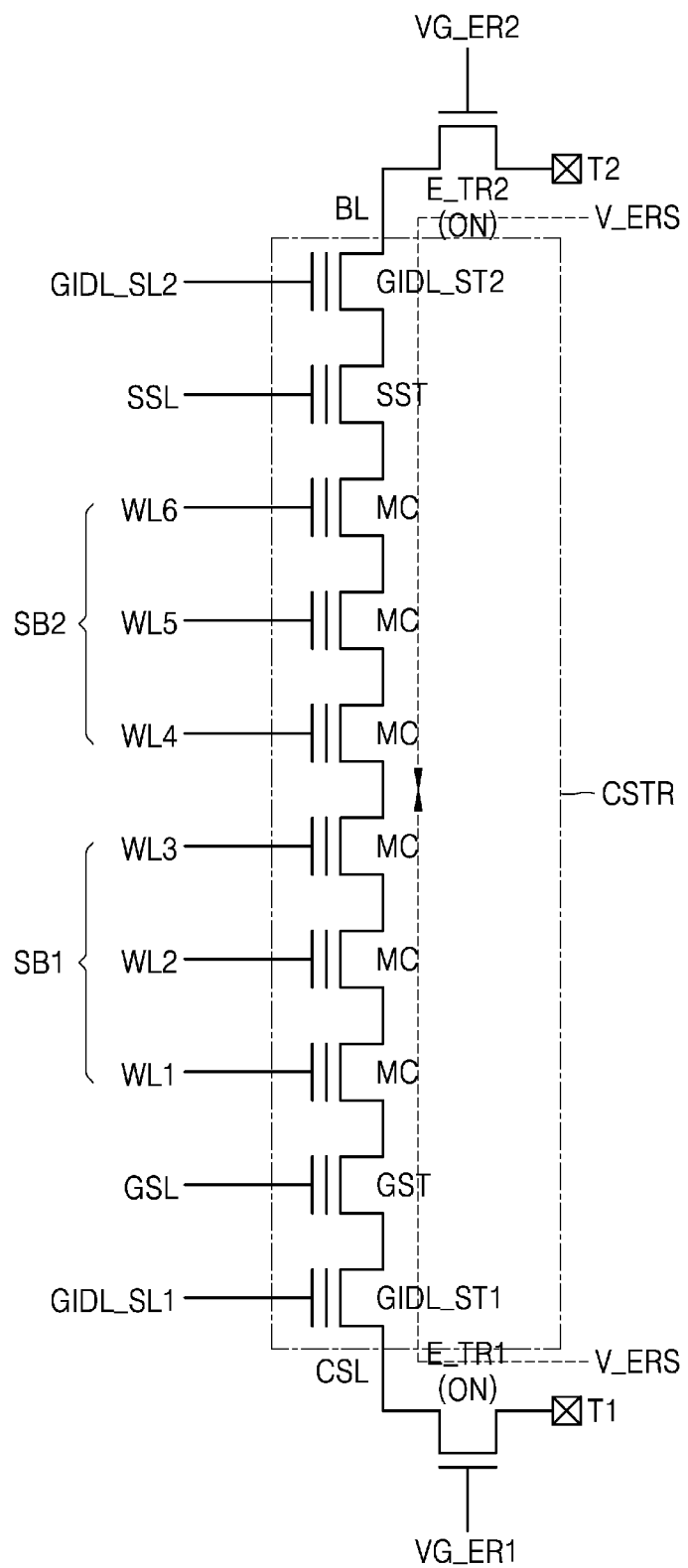
FIGS. 8A and 8B are diagrams for explaining the erase operation performed on a second sub-block in the cell string of FIG. 5 according to example embodiments.
Figure 8B:
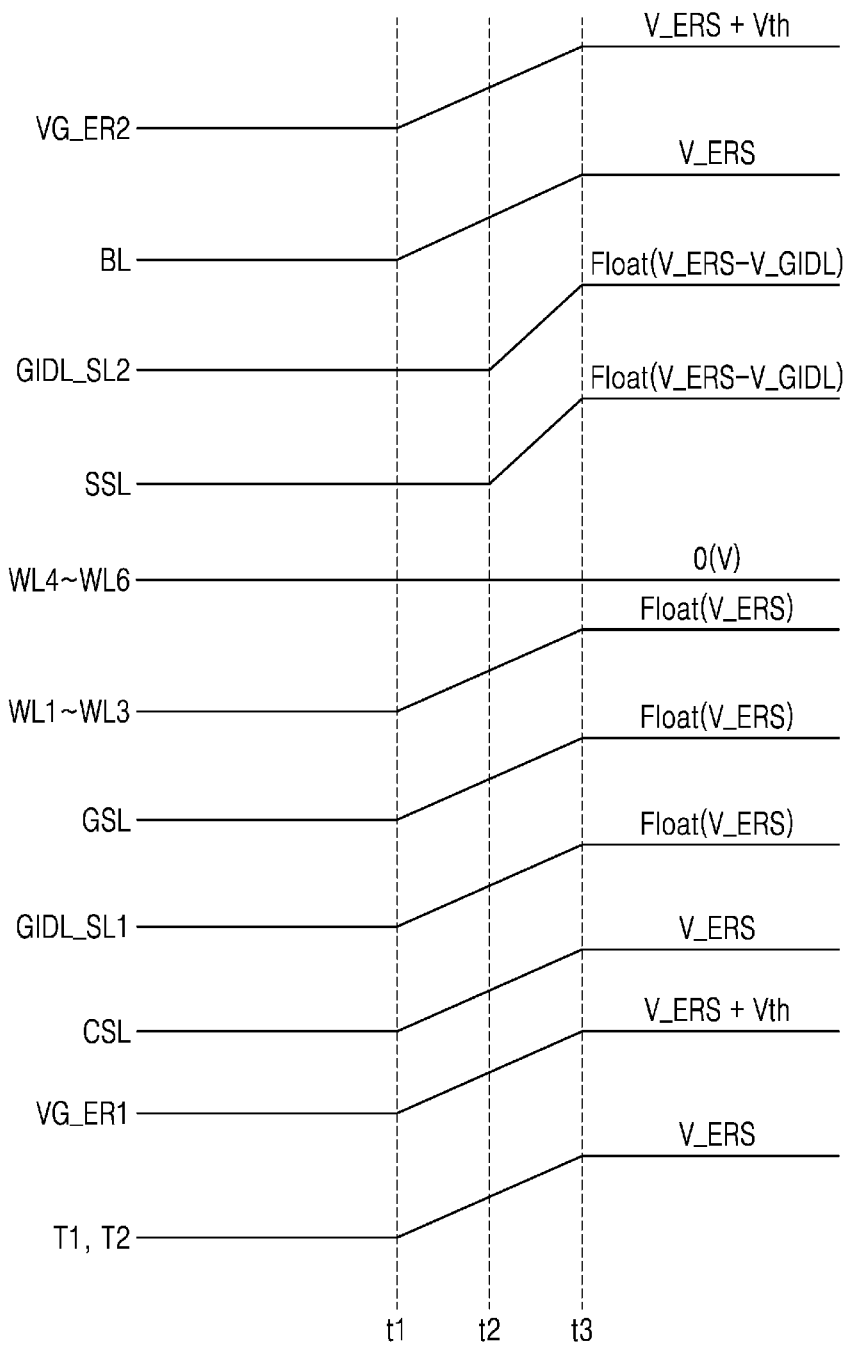

FIGS. 8A and 8B are diagrams for explaining the erase operation performed on the second sub-block SB2 in the cell string CSTR of FIG. 5 according to example embodiments.

Referring to FIG. 8A, when the erase operation is performed on the second sub-block SB2, the common source line CSL and the bit line BL may be selected as the transmission paths of the erase voltage V_ERS. A detailed operation may be described with reference further to FIG. 8B.

Referring further to FIG. 8B, the first and second gate voltages VG_ER1 and VG_ER2, which are increased from 0 V (or the low level) to the level from the first time point t1 to the third time point t3, at which the erase voltage V_ERS is added to the certain threshold voltage Vth, may be applied to the gates of the first and second erase transistors E_TR1 and E_TR2, and thus, the first and second erase transistors E_TR1 and E_TR2 may be turned on. The common source line CSL and the bit line BL may be selected as the transmission paths of the erase voltage V_ERS, and the voltages of the common source line CSL and the bit line BL may be increased from 0 V (or the low level) to the level of the erase voltage V_ERS from the first time point t1 to the third time point t3. The voltage of 0 V (or the low level) may be applied to the string selection line SSL and the second GIDL selection line GIDL_SL2 from the first time point t1 to the second time point t2, and the string selection line SSL and the second GIDL selection line GIDL_SL2 may be floated from the second time point t2. The string selection line SSL and the second GIDL selection line GIDL_SL2 may have a floating voltage, which has a level obtained by subtracting the GIDL voltage V_GIDL from the erase voltage V_ERS. The GIDL voltage V_GIDL may be generated because of the GIDL from the second GIDL selection transistor GIDL_ST2.

Because the second sub-block SB2 is the erase target sub-block, the voltage of 0 V (or the low level) may be applied to the fourth to sixth word lines WL4 to WL6. Because the first sub-block SB1 is not the erase target sub-block, the first to third word lines WL1 to WL3 may be floated to the erase voltage V_ERS from the first time point t1. Likewise, the ground selection GSL and the first GIDL selection line GIDL_SL1 may be floated to the erase voltage V_ERS from the first time point t1.

Through the above operation, in a direction from the common source line CSL to the bit line BL and a direction from the bit line BL to the common source line CSL, that is, in both directions, the channels of the first sub-block SB1 and the second sub-block SB2 may be boosted to the erase voltage V_ERS, and the memory cells MC of the second sub-block SB2 may be erased.

When the erase operation of the first sub-block SB1 is performed, the embodiments of FIGS. 8A and 8B may be applied, and detailed descriptions thereof will be omitted.

Figure 9A:
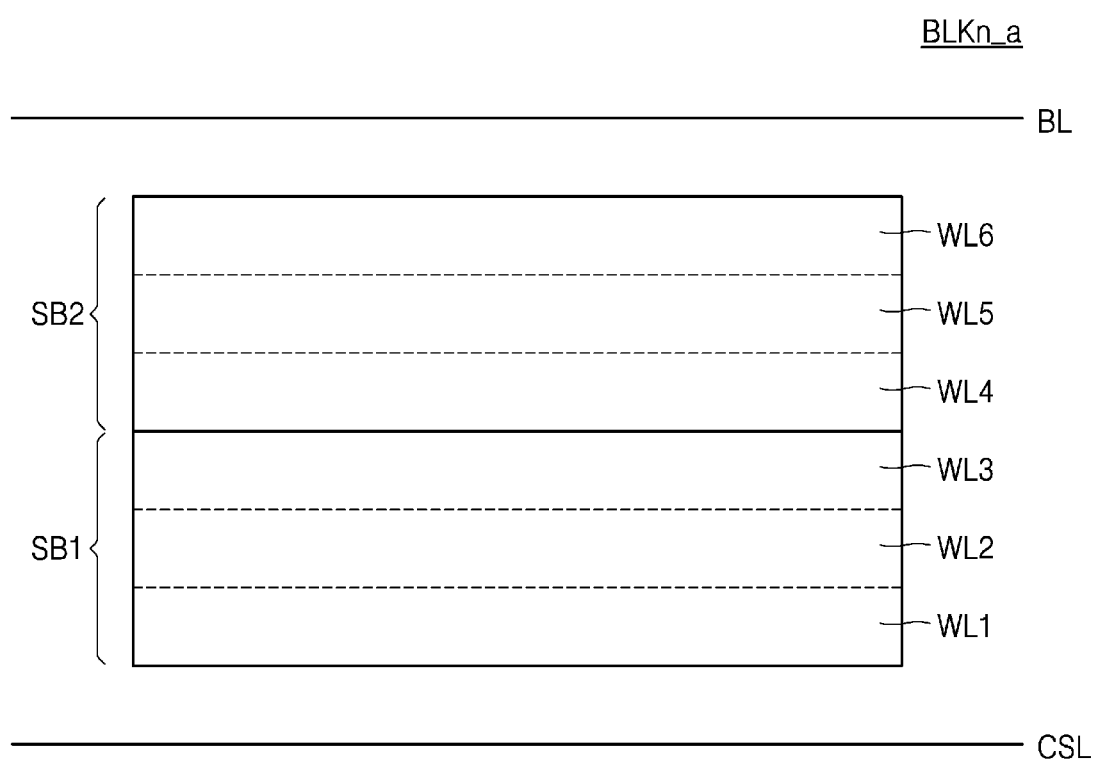
FIGS. 9A to 9C are diagrams of examples of sub-blocks included in a memory block on which an erase operation is performed, according to an example embodiment.
Figure 9B:
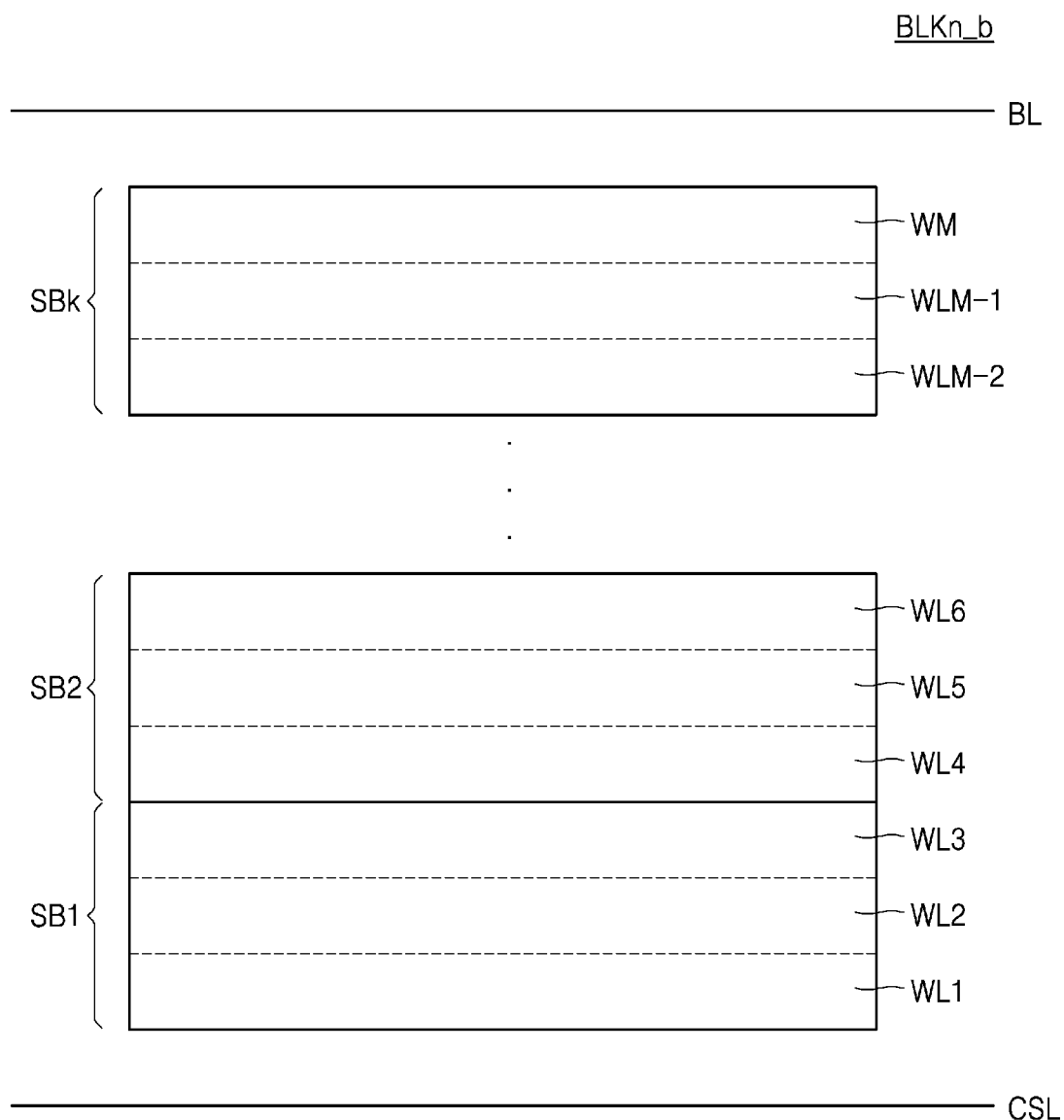
Figure 9C:
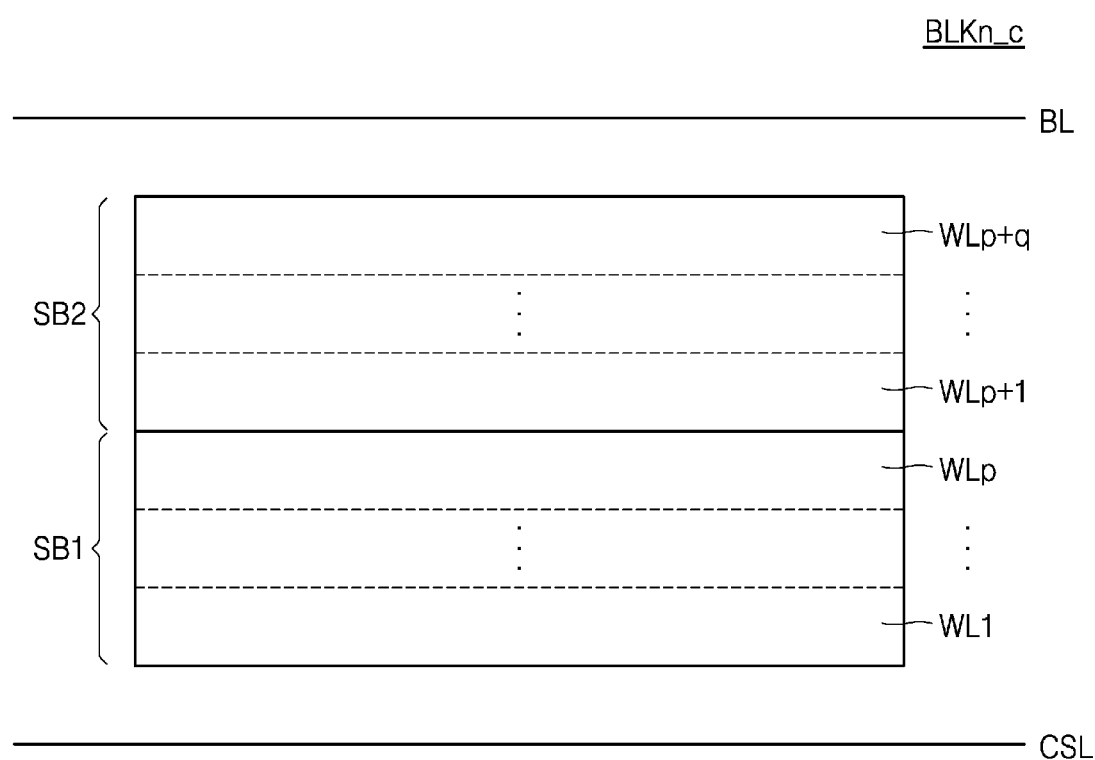

FIGS. 9A to 9C are diagrams of examples of sub-blocks included in a memory block on which an erase operation is performed, according to an example embodiment.

Referring to FIG. 9A, a memory block BLKn_a may include the first sub-block SB1 and the second sub-block SB2. For example, the first sub-block SB1 and the second sub-block SB2 may be coupled to the same number of word lines, respectively. As another example, the number of memory cells included in the first sub-block SB1 may be identical to the number of memory cells included in the second sub-block SB2. The first sub-block SB1 may be coupled to three word lines WL1 to WL3 (the first to third three word lines WL1 to WL3) and the second sub-block SB2 may be coupled to three word lines (the fourth to sixth word lines WL4 to WL6). The second sub-block SB2 may be adjacent to the bit line BL, and a position of the second sub-block SB2 may be defined as being adjacent to the bit line BL. The first sub-block SB1 may be adjacent to the common source line CSL, and a position of the first sub-block SB1 may be defined as being adjacent to the common source line CSL. Hereinafter, for consistency, the position of each sub-block is described with respect to the bit line BL or the common source line CSL, but one or more embodiments are not limited thereto. The positions of the sub-blocks may be described with respect to the string selection line or the string selection transistor instead of the bit line BL and to the ground selection line or the ground selection transistor instead of the common source line CSL.

Referring to FIG. 9B, a memory block BLKn_b may include a first sub-block SB1 to a $k^{th}$ sub-block SBk (k is a natural number greater than 2). That is, the memory block BLKn_b may include three or more sub-blocks SB1 to SBk. The sub-blocks SB1 to SBk may be respectively coupled to the same number of word lines, and the number of memory cells included in the sub-blocks SB1 to SBk may be identical to each other. However, this is merely an example, and various embodiments may be made. For example, the number of word lines connected to the sub-blocks SB1 to SBk may be different from each other, and the number of memory cells included in the sub-blocks SB1 to SBk may be different from each other. A position of each of the sub-blocks SB1 to SBk may be defined with respect to the bit line BL or the common source line CSL. For example, first to $j^{th}$ sub-blocks SB1 to SBj (where, j is a natural number less than k−1) may be defined to be adjacent to the common source line CSL, and $(j+1)^{th}$ to $k^{th}$ sub-blocks SB(j+1) to SBk may be defined to be adjacent to the bit line BL.

Information regarding the positions of the sub-blocks SB1 to SBk may be determined in advance through a memory test operation, and the information may be periodically or non-periodically updated for an effective erase operation, according to an operation environment of the memory device. In an example embodiment, the information regarding the positions of the sub-blocks SB1 to SBk may include information regarding the selected transmission path of the erase voltage during the erase operation performed on each of the sub-blocks SB1 to SBk.

Referring to FIG. 9C, a memory block BLKn_c may include the first sub-block SB1 and the second sub-block SB2 connected to the different numbers of word lines. For example, the first sub-block SB1 may be connected to p word lines WL1 to WLp, and the second sub-block SB2 may be connected to q word lines WL(p+1) to WL(p+q). For example, a ratio of the number of word lines of the first sub-block SB1 to the number of word lines of the second sub-block SB2 may vary, for example, "40:60," "50:50," "60:40," and the like.

Figure 10:
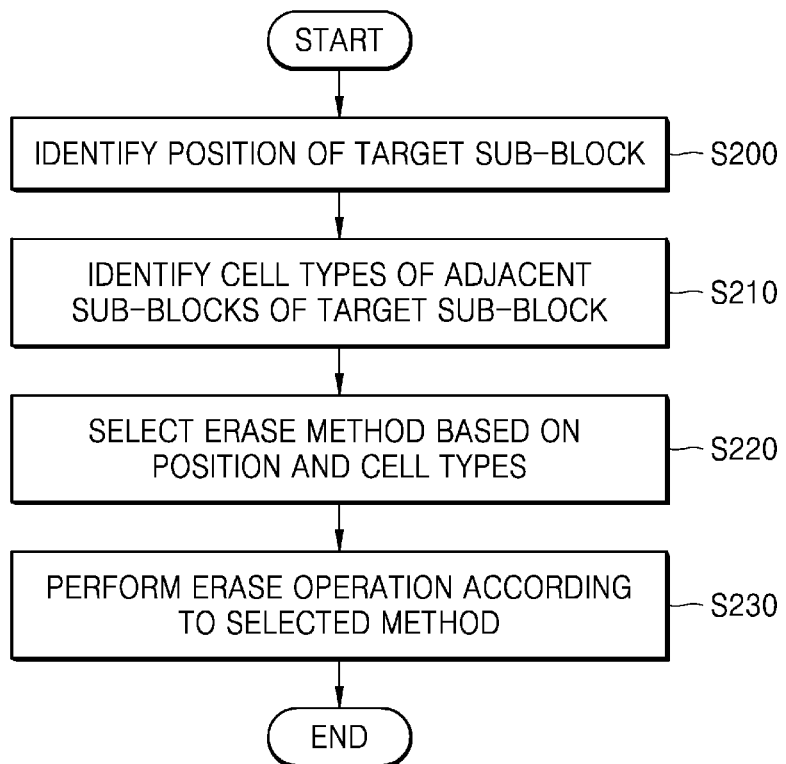
FIG. 10 is a flowchart of an operation method of a memory device, according to an example embodiment.

FIG. 10 is a flowchart of an operation method of a memory device, according to an example embodiment.

Referring to FIG. 10, in operation S200, the memory device may identify the position of the target sub-block that is the erase target sub-block. When the target sub-block is at a certain position, the memory block may perform operation S210 when, for example, the target sub-block is between the bit line and the common source line. In operation S210, the memory device may identify cell types of adjacent sub-blocks of the target sub-block. In operation S220, the memory device may select an erase method of the target sub-block, based on the position of the target sub-block and the cell types of the adjacent sub-blocks. In operation S230, the memory device may perform the erase operation on the target sub-block, according to the selected erase method.

Figure 11A:
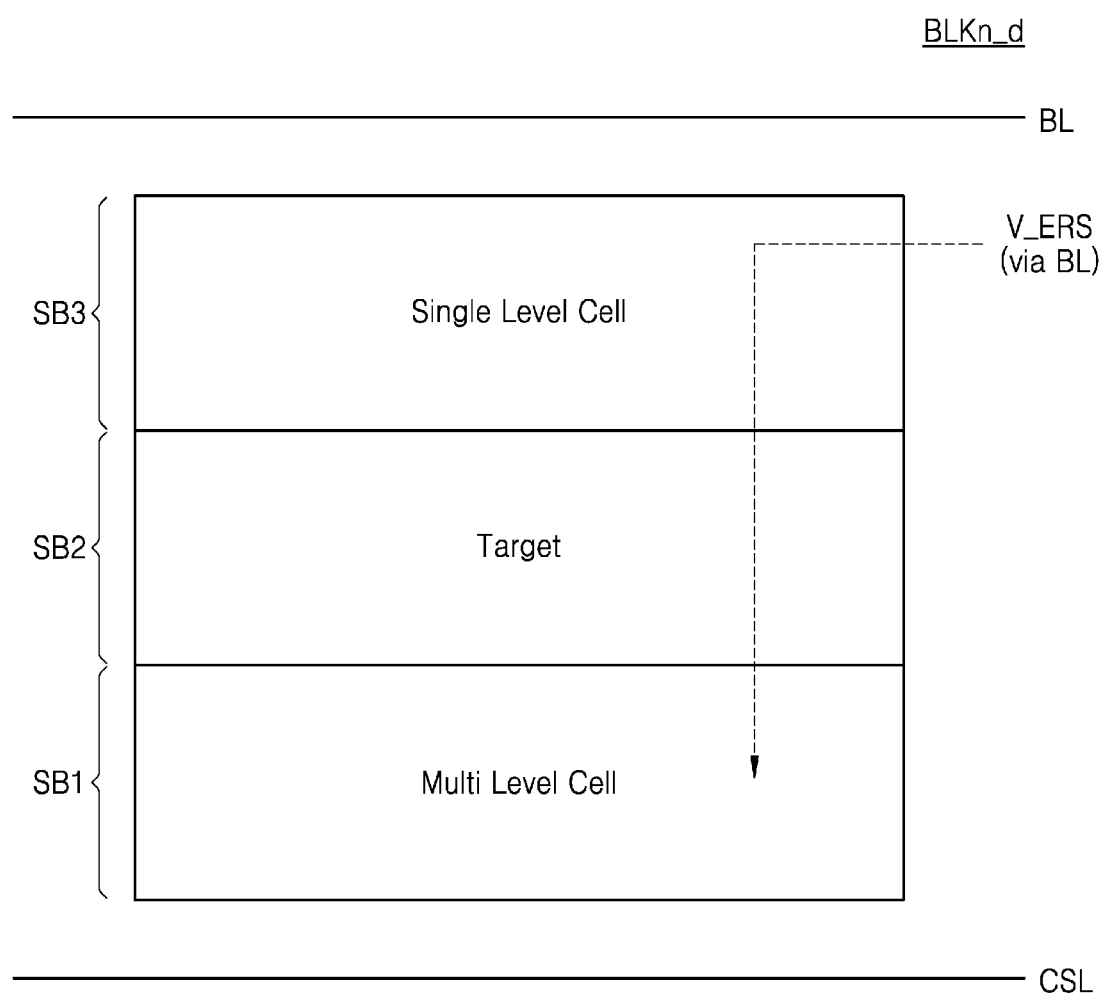
FIGS. 11A and 11B are diagrams for explaining an erase method of a second sub-block, according to example embodiments.
Figure 11B:
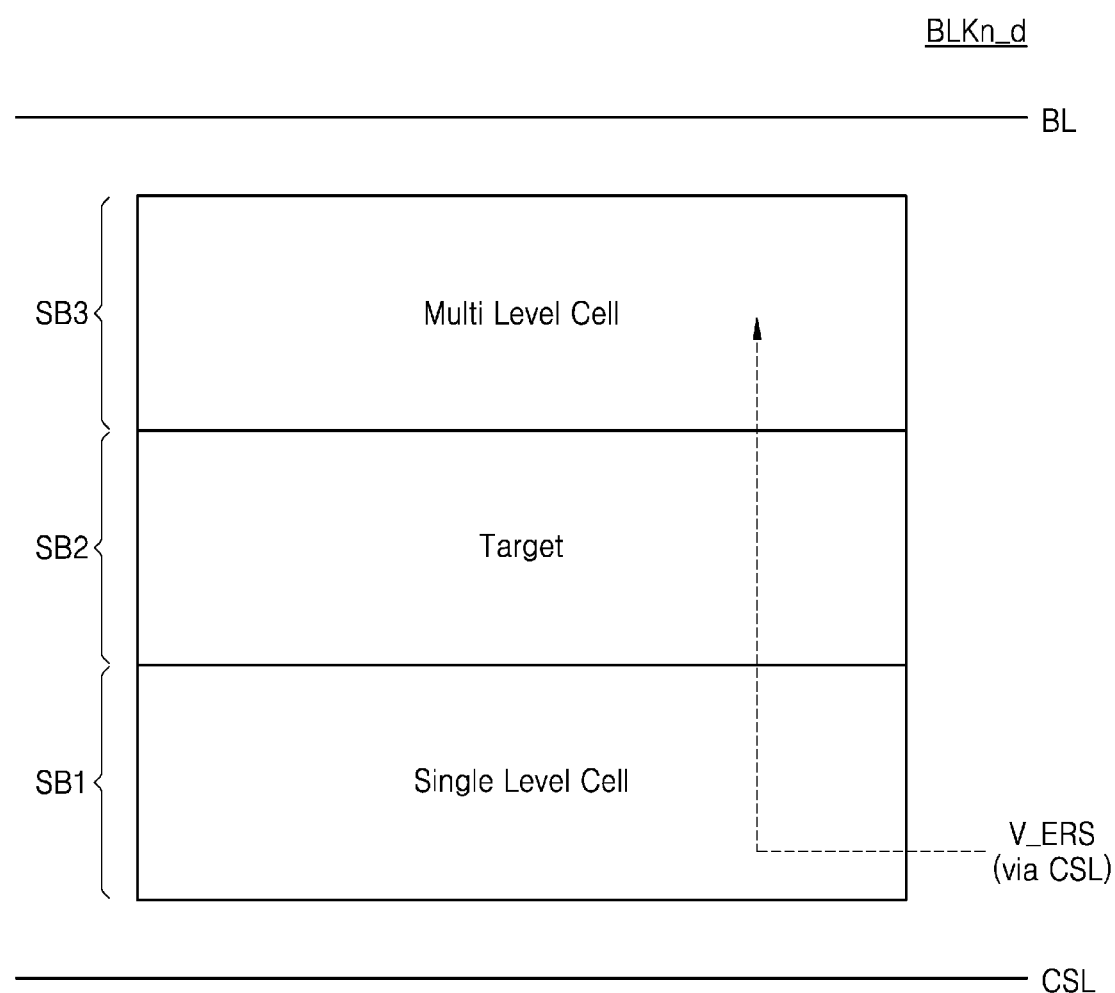

FIGS. 11A and 11B are diagrams for explaining an erase method of the second sub-block SB2, according to example embodiments.

Referring to FIG. 11A, the memory block may include the first to third sub-blocks SB1 to SB3, the second sub-block SB2 may be stacked on the first sub-block SB1, and the third sub-block SB3 may be stacked on the second sub-block SB2. When the erase operation is performed on the second sub-block SB2, the memory device may identify cell types of the first and third sub-blocks SB1 and SB3 that are adjacent to the second sub-block SB2 to select the transmission path of the erase voltage. For example, the cell type of the first sub-block SB1 may be higher than that of the third sub-block SB3. In detail, the memory cells of the first sub-block SB1 are multi-level cells and store two-bit data, and the memory cells of the third sub-block SB3 may be single-level cells and store one-bit data. The memory device may select the transmission path of the erase voltage, based on the cell types of the first and third sub-blocks SB1 and SB3.

The third sub-block SB3 operated as the single-level cells may have greater gaps between threshold voltage dispersions than the first sub-block SB1 operated as the multi-level cells, and thus, a deterioration degree of data of the third sub-block SB3 may be relatively less than that of the first sub-block SB1 because of a difference between voltages generated during the erase operation. Accordingly, the memory device may select the bit line BL, which is adjacent to the third sub-block SB3, as the transmission path of the erase voltage V_ERS and may perform the erase operation on the second sub-block SB2, by considering the third sub-block SB3 having a relatively less deterioration degree because of the erase operation.

Referring to FIG. 11B, the cell type of the first sub-block SB1 may have a lower level than the cell type of the third sub-block SB3, unlike the illustration of FIG. 11A. In detail, the memory cells of the first sub-block SB1 may be operated as the single-level cells and may store one-bit data, and the memory cells of the third sub-block SB3 may be operated as the multi-level cells and store two-bit data. The memory device may select the transmission path of the erase voltage, based on the cell types of the first and third sub-blocks SB1 and SB3. The memory device may select the common source line CSL, which is adjacent to the first sub-block SB1, as the transmission path of the erase voltage V_ERS and may perform the erase operation on the second sub-block SB2, by considering the first sub-block SB1 having the relatively less deterioration degree because of the erase operation.

The cell types of the first and third sub-blocks SB1 and SB3 of FIGS. 11A and 11B are merely examples, and one or more embodiments are not limited thereto. The spirit of the inventive concept may be applied when the first and third sub-blocks SB1 and SB3 have different cell types such as a triple-level cell and a quadruple-level cell type.

In some embodiments, when the memory block includes three or more sub-blocks, the transmission path of the erase voltage, which is selected when each sub-block is designated as an erase target sub-block, may be determined based on sub-block operation information indicating a cell type of each sub-block and a position of each sub-block, and thus, the transmission path may be stored in the memory device in advance as sub-block erase information. When the memory device performs the erase operation, a transmission path of the erase voltage that matches with the target sub-block may be quickly selected by referencing the sub-block erase information.

Figure 12:
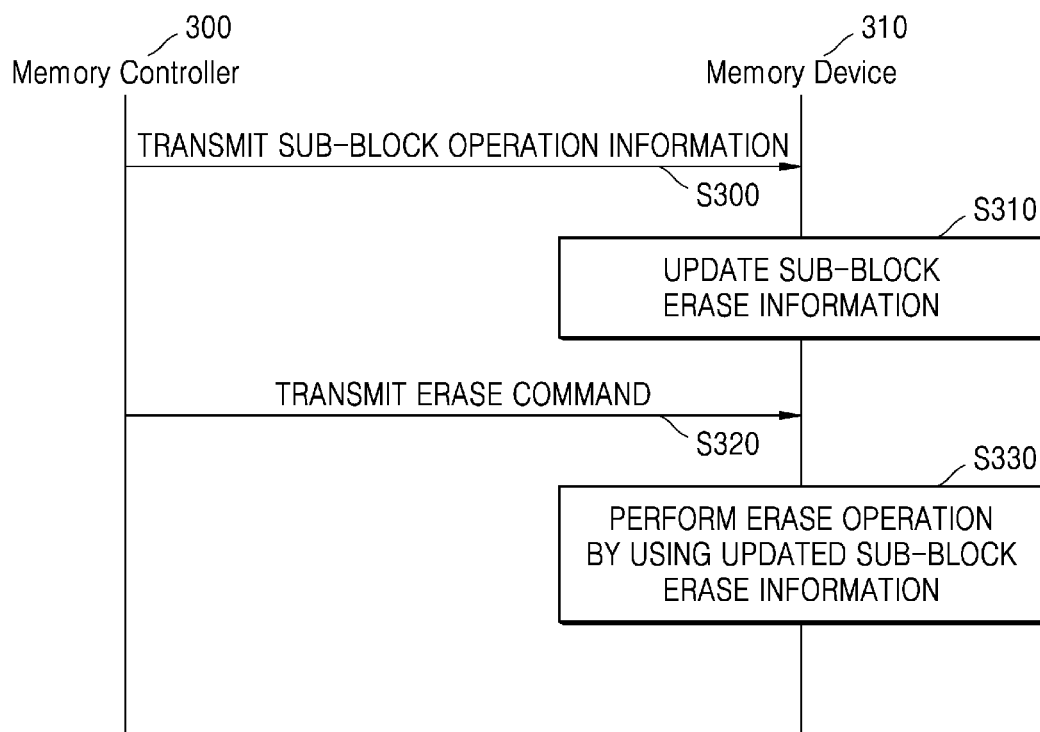
FIG. 12 is a flowchart of an operation method of a memory system, according to an example embodiment.

FIG. 12 is a flowchart of an operation method of a memory system, according to an example embodiment.

Referring to FIG. 12, the memory system may include a memory controller 300 and a memory device 310. In operation S300, the memory controller 300 may transmit, to the memory device 310, the sub-block operation information of the memory block of the memory device 310. The sub-block operation information may indicate a cell type of each sub-block. In some embodiments, the memory controller 300 may change cell types of the sub-blocks in the memory block by considering a request from a host, an operation environment of the memory system, or the like, and may transmit sub-block operation information, which includes content regarding the changed cell types, to the memory device 310. In operation S310, the memory device 310 may update sub-block erase information, based on the sub-block operation information. As described above, when each sub-block is selected as an erase target sub-block, the sub-block erase information may indicate the transmission path of the erase voltage selected for the erase operation. In operation S320, the memory controller 300 may transmit, to the memory device 310, an erase command regarding the target sub-block. In operation S330, the memory device 310 may perform the erase operation on the target sub-block by using the updated sub-block erase information in response to the erase command.

Figure 13:
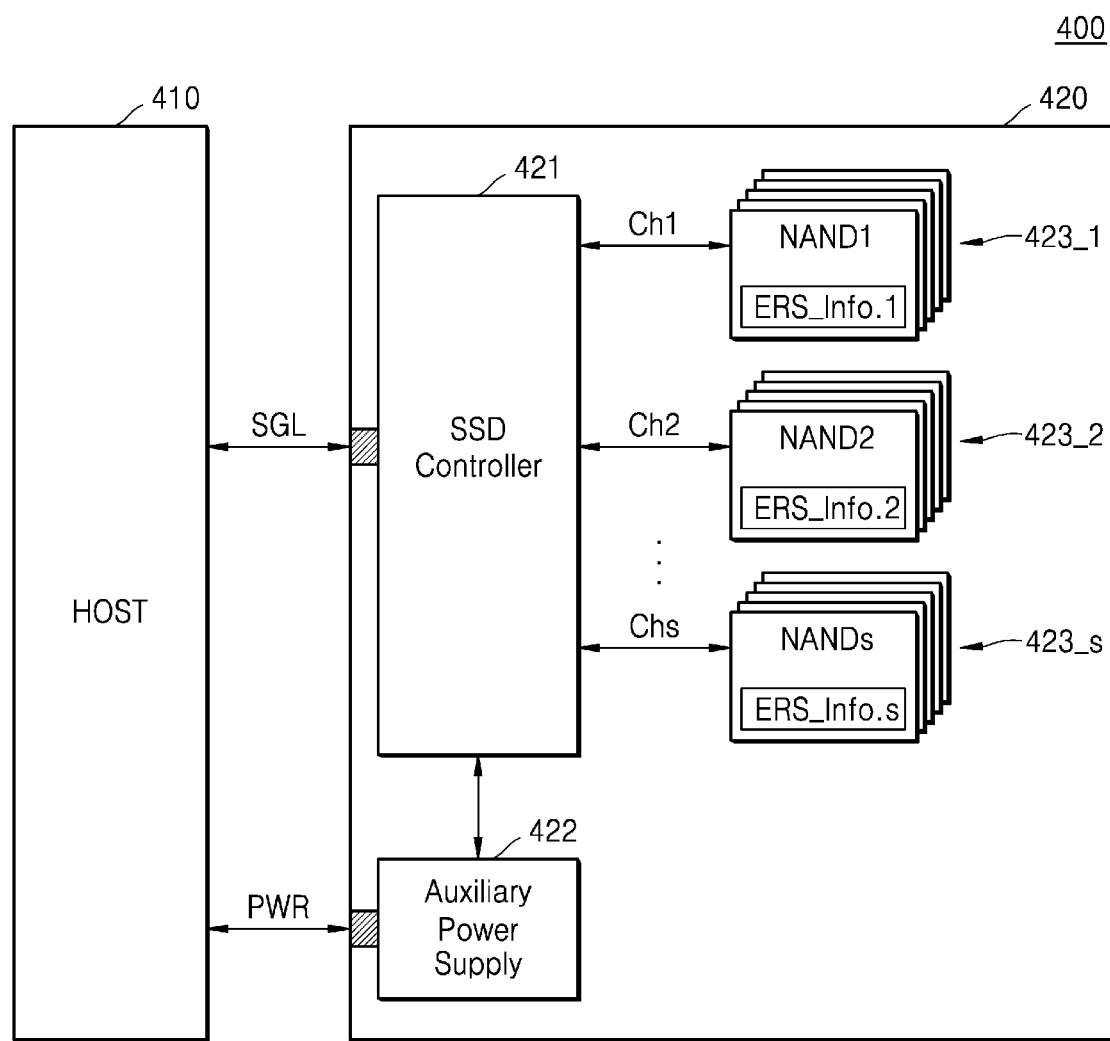
FIG. 13 is a block diagram of a Solid State Drive (SSD) system according to an example embodiment.

FIG. 13 is a block diagram of a Solid State Drive (SSD) system 400 according to an example embodiment.

Referring to FIG. 13, the SSD system 400 may include a host 410 and an SSD 420. The SSD 420 may exchange signals with the host 410 through a signal connector and may receive power through a power connector. The SSD 420 may include an SSD controller 421, an auxiliary power supply 422, and first to s$^{th}$ memory devices 423_1 to 423_s (s is a natural number greater than 1). Each of the first to s$^{th}$ memory devices 423_1 to 423_s may include one or more memory devices disclosed previously. In some examples, the first memory device 423_1 may employ one memory device 100 in FIG. 1 or a plurality of memory devices. In this case, the embodiments of FIGS. 1, 2A to 2D, 3 to 5, 6A, 6B, 7A, 7B, 8A, 8B, 9A to 9C, 10, 11A, 11B and 12 may be applied to the first to s$^{th}$ memory devices 423_1 to 423_s. For example, the first to s$^{th}$ memory devices 423_1 to 423_s may include first to s$^{th}$ sub-block erase information ERS_Info.1~ERS_Info.s indicating the transmission path of the erase voltage selected during the erase operation performed on each sub-block of the memory block included in each of the first to s$^{th}$ memory devices 423_1 to 423_s. As described above, the transmission path of the erase voltage, which is selected during the erase operation performed on each sub-block, may be determined by considering at least one of the position of the sub-block and the cell types of the adjacent sub-blocks. The first to s$^{th}$ memory devices 423_1 to 423_s may perform the erase operation on the target sub-blockby using the first to s$^{th}$ sub-block erase information ERS_Info.1 to ERS_Info.s.

Figure 14:
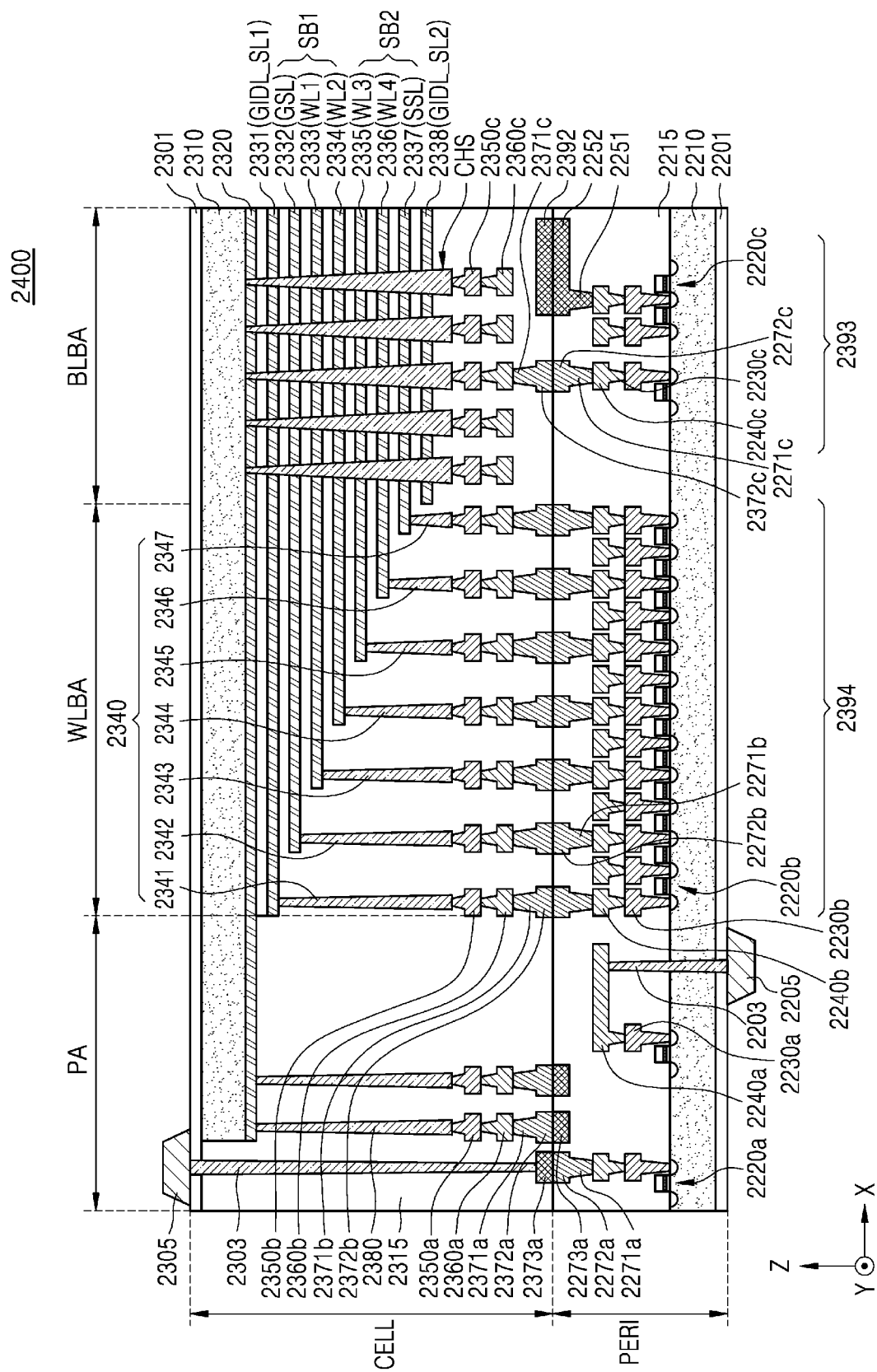
FIG. 14 is a cross-sectional view for explaining a memory device as an example of the memory device of FIG. 1 according to example embodiments.

FIG. 14 is a cross-sectional view for explaining a memory device 2400 as an example of the memory device 100 of FIG. 1 according to example embodiments.

Referring to FIG. 14, the memory device 2400 may have a Chip-to-Chip (C2C) structure. The C2C structure may indicate that an upper chip including the cell region CELL is manufactured on a first wafer, a lower chip including the peripheral circuit region PERI is manufactured on a second wafer that is different from the first wafer, and then the upper chip and the lower chip are connected to each other according to a bonding method. For example, the bonding method may indicate a method whereby a bonding metal, which is formed on an uppermost metal layer of the upper chip, is electrically connected to a bonding metal, which is formed on an uppermost metal layer of the lower chip. For example, when the bonding metal includes copper (Cu), the bonding method may be a Cu—Cu bonding method, and the bonding metal may include aluminum or tungsten.

The peripheral circuit region PERI and the cell region CELL of the memory device 2400 may each include an external pad bonding area PA, a word line bonding area WLBA, and a bit line bonding area BLBA.

The peripheral circuit region PERI may include a first substrate 2210, an interlayer insulation layer 2215, circuit elements 2220a, 2220b, and 2220c formed on the first substrate 2210, first metal layers 2230a, 2230b, and 2230c respectively connected to the circuit elements 2220a, 2220b, and 2220c, second metal layers 2240a, 2240b, and 2240c formed on the first metal layers 2230a, 2230b, and 2230c. Each of the circuit elements 2220a, 2220b, and 2220c may correspond to one or more transistors. In an embodiment, the first metal layers 2230a, 2230b, and 2230c may include tungsten having a relatively high resistance, and the second metal layers 2240a, 2240b, and 2240c may include copper having a relatively low resistance.

In the present disclosure, the first metal layers 2230a, 2230b, and 2230c and the second metal layers 2240a, 2240b, and 2240c are illustrated only, but one or more embodiments are not limited thereto. At least one metal layer may be further formed on the second metal layers 2240a, 2240b, and 2240c. At least part of the at least one metal layer formed on the second metal layers 2240a, 2240b, and 2240c may include aluminum having a lower resistance than copper included in the second metal layers 2240a, 2240b, and 2240c.

The interlayer insulation layer 2215 may be formed on the first substrate 2210 to cover the circuit elements 2220a, 2220b, and 2220c, the first metal layers 2230a, 2230b, and 2230c, and the second metal layers 2240a, 2240b, and 2240c, and may include an insulation material such as silicon oxide or silicon nitride.

Lower bonding metals 2271b and 2272b may be formed on the second metal layer 2240b in the word line bonding area WLBA. In the word line bonding area WLBA, the lower bonding metals 2271b and 2272b of the peripheral circuit region PERI may be electrically connected to upper bonding metals 2371b and 2372b of the cell region CELL according to the bonding method, and the lower bonding metals 2271b and 2272b and the upper bonding metals 2371b and 2372b may each include aluminum, copper, tungsten, or the like.

The cell region CELL may provide at least one memory block. The cell region CELL may include a second substrate 2310 and a first common source line 2320. On the second substrate 2310, word lines 2333 to 2336 (WL1 to WL4) may be stacked in a direction (a Z-axis direction) perpendicular to an upper surface of the second substrate 2310. A string selection line 2337 (SSL) and a ground selection line 2332 (GSL) may be respectively arranged on upper and lower portions of the word lines 2333 to 2336 (WL1 to WL4). The string selection line 2337 (SSL), the ground selection line 2332 (GSL), and the word lines 2333 to 2336 (WL1 to WL4) may be arranged between first and second GIDL selection lines 2331 and 2338 (GIDL_SL1 and GIDL_SL2).

In the bit line bonding area BLBA, the channel structure CHS may extend in a direction perpendicular to the second substrate 2310 and may penetrate the word lines 2333 to 2336 (WL1 to WL4), the first and second GIDL selection lines 2331 and 2338 (GIDL_SL1 and GIDL_SL2), the string selection line 2337 (SSL), and the ground selection line 2332 (GSL). The channel structure CHS may include a data storage layer, a channel layer, a buried insulation layer, and the like, and the channel layer may be electrically connected to a first metal layer 2350c and a second metal layer 2360c. For example, the first metal layer 2350c may be a bit line contact, and the second metal layer 2360c may be a first bit line. In an embodiment, the first bit line 2360c may extend in a first direction (a Y-axis direction) parallel to an upper surface of the second substrate 2310.

In an embodiment illustrated in FIG. 14, an area where the channel structure CHS, the first bit line 2360c, and the like are arranged may be defined as the bit line bonding area BLBA. The first bit line 2360c may be electrically connected to the circuit elements 2220c providing the page buffer 2393 in the peripheral circuit region PERI in the bit line bonding area BLBA. For example, the first bit line 2360c may be connected to upper bonding metals 2371c and 2372c in the peripheral circuit region PERI, and the upper bonding metals 2371c and 2372c may be connected to lower bonding metals 2271c and 2272c connected to the circuit elements 2220c of the page buffer 2393.

In the word line bonding area WLBA, the word lines 2332 to 2337 (WL1 to WL6) may extend in a second direction (an X-axis direction) parallel to the upper surface of the second substrate 2310 and may be connected to cell contact plugs 2341 to 2347 (2340). The word lines 2332 to 2337 (WL1 to WL6) and the cell contact plugs 2340 may be connected to pads that are provided as at least some of the word lines 2333 to 2336 (WL1 to WL4) extend in different lengths in the second direction. The first metal layer 2350b and the second metal layer 2360b may be sequentially connected to upper portions of the cell contact plugs 2340 connected to the word lines 2333 to 2336 (WL1 to WL4). In the word line bonding area WLBA, the cell contact plugs 2340 may be connected to the peripheral circuit region PERI through the upper bonding metals 2371b and 2372b of the cell region CELL and the lower bonding metals 2271b and 2272b of the peripheral circuit region PERI.

The cell contact plugs 2340 may be electrically connected to the circuit elements 2220b providing the row decoder 2394 in the peripheral circuit region PERI. In an embodiment, operation voltages of the circuit elements 2220b providing the row decoder 2394 may be different from operation voltages of circuit elements 2220c providing the page buffer 2393. For example, the operation voltages of the circuit elements 2220c providing the page buffer 2393 may be greater than the operation voltages of the circuit elements 2220b providing the row decoder 2394.

In the external pad bonding area PA, the common source line contact plug 2380 may be arranged. The common source line contact plug 2380 may include a conductive material such as metal, a metal compound, or polysilicon and may be electrically connected to the common source line 2320. The first metal layer 2350a and the second metal layer 2360a may be sequentially stacked on the common source line contact plug 2380. For example, an area where the source line contact plug 2380, the first metal layer 2350a, and the second metal layer 2360a are arranged may be defined as the external pad bonding area PA.

In the external pad bonding area PA, input/output pads 2205 and 2305 may be arranged. Referring to FIG. 14, a lower insulation layer 2201 covering a lower surface of the first substrate 2210 may be formed on a lower portion of the first substrate 2210, and the first input/output pad 2205 may be formed on the lower insulation layer 2201. The first input/output pad 2205 may be connected to at least one of the circuit elements 2220a, 2220b, and 2220c arranged in the peripheral circuit region PERI through the first input/output contact plug 2203 and may be separated from the first substrate 2210 by the lower insulation layer 2201. Also, a side insulation layer may be arranged between the first input/output contact plug 2203 and the first substrate 2210 and may electrically separate the first input/output contact plug 2203 from the first substrate 2210.

Referring to FIG. 14, an upper insulation layer 2301 covering an upper surface of the second substrate 2310 may be formed on an upper portion of the second substrate 2310, and the second input/output pad 2305 may be arranged on the upper insulation layer 2301. The second input/output pad 2305 may be connected to at least one of the circuit elements 2220a, 2220b, and 2220c arranged in the peripheral circuit region PERI through a second input/output contact plug 2303.

According to example embodiments, in an area where the second input/output contact plug 2303 is arranged, the second substrate 2310, the first common source line 2320, and the like may not be arranged. Also, the second input/output pad 2305 may not overlap the word lines 2333 to 2336 (WL1 to WL4) in the third direction (the Z-axis direction). Referring to FIG. 14, the second input/output contact plug 2303 may be separated from the second substrate 2310 in a direction parallel to the upper surface of the second substrate 2310 and may be connected to the second input/output pad 2305 by penetrating the interlayer insulation layer 2315 in the cell region CELL.

According to embodiments, the first input/output pad 2205 and the second input/output pad 2305 may be selectively formed. For example, the memory device 2400 may only include the first input/output pad 2205 arranged on the first substrate 2210 or may only include the second input/output pad 2305 arranged on the second substrate 2310. Alternatively, the memory device 2400 may include both the first input/output pad 2205 and the second input/output pad 2305.

In the external pad bonding area PA and the bit line bonding area BABA respectively included in the cell region CELL and the peripheral circuit region PERI, metal patterns of the uppermost metal layer may be dummy patterns, or the uppermost metal layer may be omitted.

In the external pad bonding area PA, lower metal patterns 2273a of the peripheral circuit region PERI electrically connected to upper bonding metals 2371a and 2372a of the cell region CELL may be formed on the uppermost metal layer in the peripheral circuit region PERI, corresponding to upper metal patterns 2373a formed on the uppermost metal layer of the cell region CELL. The lower metal pattern 2273a formed on the uppermost metal layer in the peripheral circuit region PERI may not be connected to a separate contact in the peripheral circuit region PERI. As described, in the external pad bonding area PA, upper metal patterns (e.g., 2373a) having the same shapes as the lower metal patterns (e.g., 2273a) in the peripheral circuit region PERI may be formed on the upper metal layer in the cell region CELL, corresponding to the lower metal pattern (e.g., 2273a) formed on the uppermost metal layer in the peripheral circuit region PERI.

In the external pad bonding area PA, the upper metal patterns 2373a of the cell region CELL may be electrically connected to lower bonding metals 2271a and 2272a of the peripheral circuit region PERI.

The lower bonding metals 2271b and 2272b may be formed on the second metal layer 2240b of the word line bonding area WLBA. In the word line bonding area WLBA, the lower bonding metals 2271b and 2272b of the peripheral circuit region PERI may be electrically connected to the upper bonding metals 2371b and 2372b of the cell region CELL according to the bonding method.

Also, in the bit line bonding area BLBA, the upper metal pattern 2392, which has the same shape as the lower metal pattern 2252 of the peripheral circuit region PERI, may be formed on the uppermost metal layer of the cell region CELL, corresponding to the lower metal pattern 2252 formed on the uppermost metal layer of the peripheral circuit region PERI. Contacts may not be formed on the upper metal pattern 2392 formed on the uppermost metal layer of the cell region CELL.

In an example embodiment, the first sub-block SB1 may be adjacent to the first common source line CSL (2320) or the second substrate 2310 and may include the memory cells MC connected to the first and second word lines 2333 and 2334 (WL1 and WL2). The second sub-block SB2 may be adjacent to the first bit line 2360c or the peripheral circuit region PERI and may include the memory cells MC connected to the third and fourth word lines 2335 and 2336 (WL3 and WL4). However, this is merely an example, and one or more embodiments are not limited thereto. The first sub-block SB1 and the second sub-block SB2 may further include memory cells connected to a greater number of word lines.

When the memory device 2400 performs the erase operation, and when the target sub-block is the first sub-block SB1, the first common source line 2320 may be selected as the transmission path of the erase voltage, and when the target sub-block is the second sub-block SB2, the first bit line 2360c may be selected as the transmission path of the erase voltage. The one or more embodiments of the inventive concept may be applied to the memory device 2400.

In example embodiments, a memory cell array or a memory block described with reference to FIGS. 1, 2A to 2D, and 3 may be included in the cell region CELL. Peripheral circuits (e.g., the page buffer circuit 120, the control logic 130, the voltage generator 140, the row decoder 150, and the data input/output circuit 160) described with reference to FIG. 1 may be included in the peripheral circuit region PERI.

FIGS. 15A to 15D are cross-sectional views of memory devices 3400a to 3400c having a C2C structure as an example of the memory device 100 of FIG. 1 according to example embodiments.

Figure 15A:
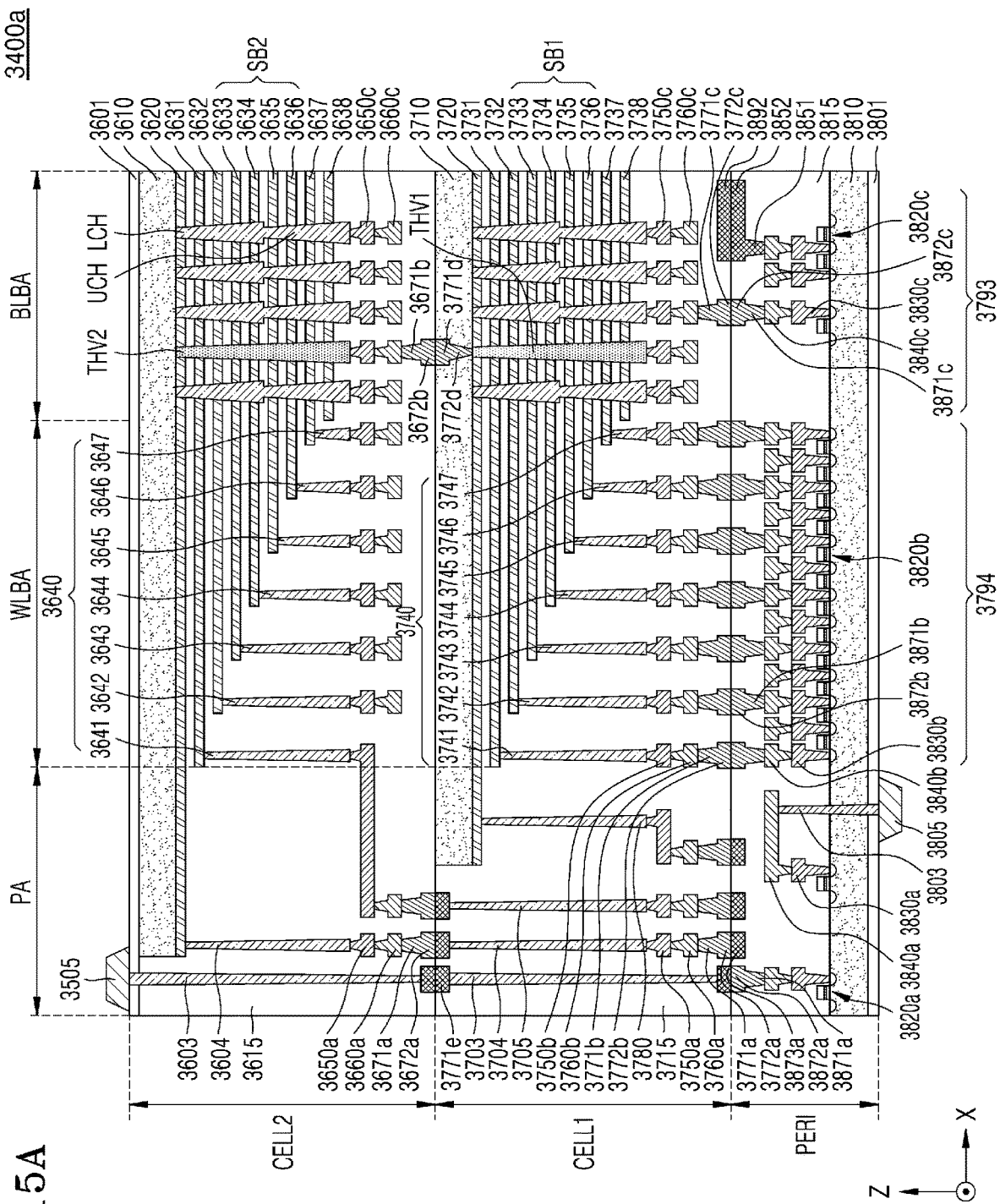
FIGS. 15A to 15D are cross-sectional views of memory devices each having a Chip to Chip (C2C) structure as examples of the memory device of FIG. 1 according to example embodiments.

Referring to FIG. 15A, compared to the memory device 2400 of FIG. 14, the memory device 3400a may include two or more upper chips including cell regions. In detail, the memory device 3400a may have a structure in which a first upper chip including a first cell region CELL1, a second upper chip including a second cell region CELL2, and a lower chip including the peripheral circuit region PERI are connected according to the bonding method. However, the number of upper chips is not limited thereto. Regarding the descriptions of the first cell region CELL1 and the second cell region CELL2, the descriptions already provided with reference to FIG. 14 will not be repeated. Hereinafter, the cell region CELL may denote at least one of the first cell region CELL1 and the second cell region CELL2.

In the bit line bonding area BLBA, the cell region CELL may include a lower channel LCH and an upper channel UCH that are connected to each other. The lower channel LCH and the upper channel UCH may be connected to each other and may form one channel structure CHS. That is, unlike the channel structure CHS of FIG. 14, the channel structure CHS of FIG. 15 may be formed through a process regarding the upper channel UCH and a process regarding the lower channel LCH. In the first cell region CELL1, the lower channel LCH may extend in a direction perpendicular to an upper surface of a third substrate 3610 and may penetrate a second common source line 3620, a first GIDL selection line 3631, a second ground selection line 3632, and second lower word lines 3633 and 3634. The lower channel LCH may include the data storage layer, the channel layer, the buried insulation layer, and the like, and may be connected to the upper channel UCH. The upper channel UCH may penetrate second upper word lines 3635 and 3636, a second string selection line 3637, and a second GIDL selection line 3638. The upper channel UCH may include the data storage layer, the channel layer, the buried insulation layer, and the like, and the channel layer of the upper channel UCH may be electrically connected to a third metal layer 3650c and a fourth metal layer 3660c. The longer the channel lengths are, the more difficult it is to form channels having uniform widths because of processes. The memory device 3400a may have channels having widths with improved uniformity through the lower channel LCH and the upper channel UCH that are formed according to sequential processes.

The second string selection line 3637 and the second ground selection line 3632 may be arranged above and under the second lower word lines 3633 and 3634 and the second upper word lines 3635 and 3636. The second word lines 3633 to 3636, the second string selection line 3637, and the second ground selection line 3632 may be arranged between the first and second GIDL selection lines 3631 and 3638.

In an example embodiment, the memory device 3400a may further include word lines adjacent to the second string selection line 3637 and dummy word lines adjacent to the second ground selection line 3632. In some embodiments, the memory device 3400a may further include dummy word lines arranged on a boundary of the lower channel LCH and the upper channel UCH.

In the bit line bonding area BLBA, the first cell region CELL1 may include a first through electrode THV1, and the second cell region CELL2 may include a second through electrode THV2. The second through electrode THV2 may penetrate the second common source line 3620 and the word lines 3633 to 3636. The second through electrode THV2 may include a conductive material. Alternatively, the second through electrode THV2 may include a conductive material surrounded by insulation materials. The first through electrode THV1 may include the same material as the second through electrode THV2. The first through electrode THV1 and the second through electrode THV2 may be electrically connected to each other through a first through upper metal pattern 3672b and a second through lower metal pattern 3771d. The first through upper metal pattern 3672b may be formed on an upper end of the second upper chip including the second cell region CELL2 w, and the second through lower metal pattern 3771d may be formed on a lower end of the first upper chip including the first cell region CELL1. The second through electrode THV2 may be electrically connected to the third metal layer 3650c and the fourth metal layer 3660c. A first through via 3671b may be formed between the fourth metal layer 3660c and the first through upper metal pattern 3672b, and a second through via 3772d may be formed between the first through electrode THV1 and the second through lower metal pattern 3771d. The first through upper metal pattern 3672b and the second through lower metal pattern 3771d may be connected to each other according to the bonding method.

According to an embodiment, a first upper metal pattern 3672a may be formed on an upper portion of the second cell region CELL2, and a first lower metal pattern 3771e may be formed on a lower portion of the first cell region CELL1. The first upper metal pattern 3672a of the second cell region CELL2 and the first lower metal pattern 3771e of the first cell region CELL1 may be connected to each other in the external pad bonding area PA, according to the bonding method. The second upper metal pattern 3772a may be formed on an upper portion of the first cell region CELL1, and the second lower metal pattern 3873a may be formed on an upper portion of the peripheral circuit region PERI. The second upper metal pattern 3772a of the first cell region CELL1 and the second lower metal pattern 3873a of the peripheral circuit region PERI may be connected to each other in the external pad bonding area PA according to the bonding method. The fourth metal layer 3660c may be a second bit line.

In an example embodiment, the first cell region CELL1 may include the first sub-block SB1 including the memory cells connected to first word lines 3733 to 3736. The second cell region CELL2 may include the second sub-block SB2 including the memory cells connected to the second word lines 3633 to 3636.

In an example embodiment, a direction from the channel of the first sub-block SB1 to the erase voltage during the erase operation on the first sub-block SB1 of the first cell region CELL1 may be different from a direction from the channel of the second sub-block SB2 to the erase voltage during the erase operation on the second sub-block SB2 of the second cell region CELL2. For example, a first bit line 3760C may be selected as the transmission path of the erase voltage during the erase operation on the first sub-block SB1, and the channel of the first sub-block SB1 may be boosted from the first bit line 3760C towards the first common source line 3720 because of the erase voltage. The second common source line 3620 may be selected as the transmission path of the erase voltage during the erase operation on the second sub-block SB2, and the channel of the second sub-block SB2 may be boosted by the erase voltage in a direction from the second common source line 3620 to the second bit line 3660c. As another example, a first common source line 3720 may be selected as the transmission path of the erase voltage during the erase operation on the first sub-block SB1, and the channel of the first sub-block SB1 may be boosted by the erase voltage in a direction from the first common source line 3720 to the first bit line 3760c. The second bit line 3660c may be selected as the transmission path of the erase voltage during the erase operation on the second sub-block SB2, and the channel of the second sub-block SB2 may be boosted by the erase voltage in a direction from the second bit line 3660c to the second common source line 3620.

However, this is merely an example, and one or more embodiments are not limited thereto. A direction, in which the channel of the first sub-block SB1 is boosted by the erase voltage during the erase operation on the first sub-block SB1, may be identical to a direction, in which the channel of the second sub-block SB2 may be boosted by the erase voltage during the erase operation on the second sub-block SB2. For example, the first bit line 3760c may be selected as the transmission path of the erase voltage during the erase operation on the first sub-block SB1, and the second bit line 3660c may be selected as the transmission path of the erase voltage during the erase operation on the second sub-block SB2. Thus, the above directions may be identical to each other.

Figure 15B:
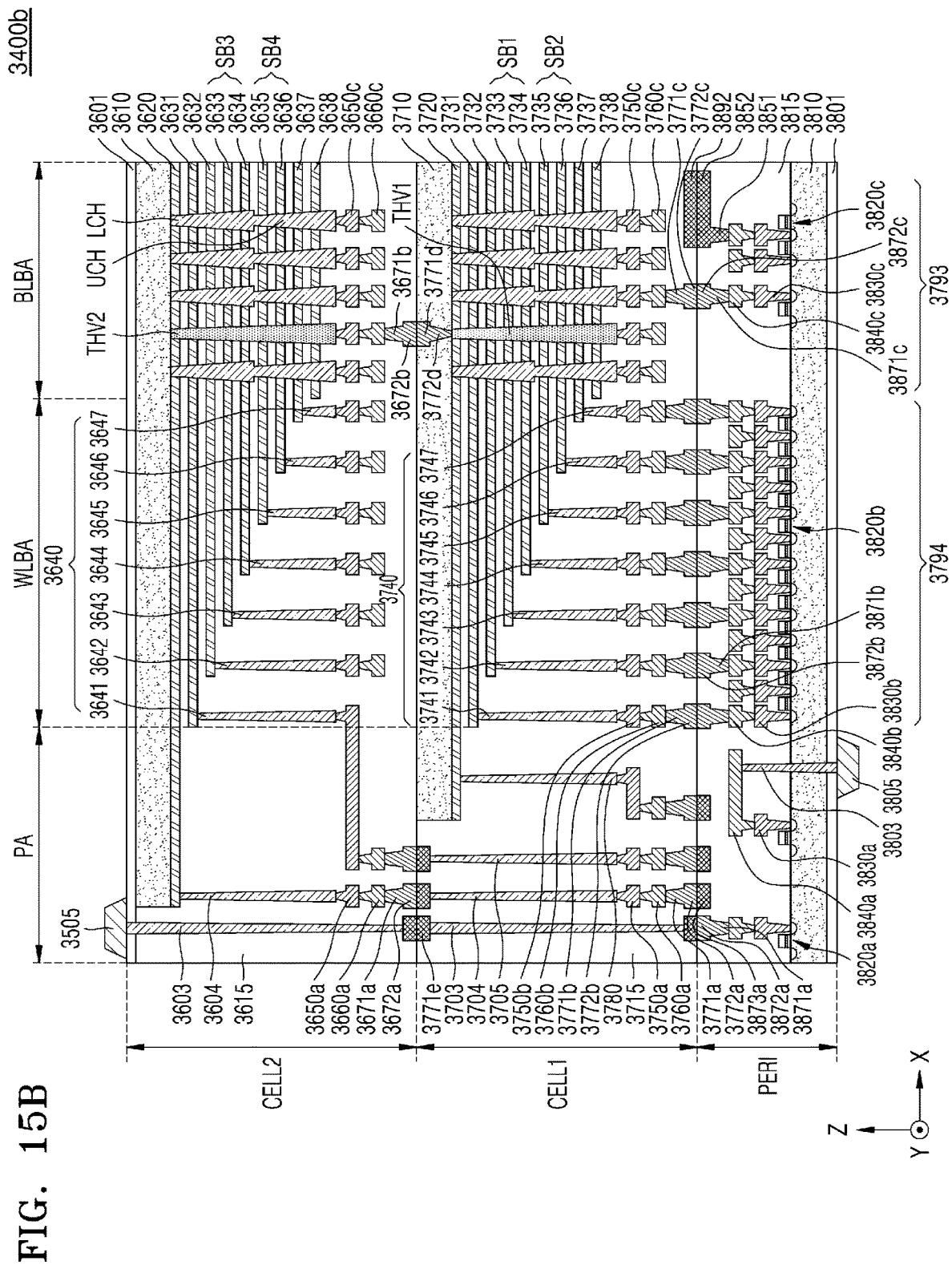

Referring further to FIG. 15B, in an example embodiment, the first cell region CELL1 may include the first sub-block SB1 including the memory cells connected to the word lines 3733 and 3734 and the second sub-block SB2 including the memory cells connected to the word lines 3735 and 3736. The second cell region CELL2 may include the third sub-block SB3 including the memory cells connected to the word lines 3633 and 3634 and the fourth sub-block SB4 including the memory cells connected to the word lines 3635 and 3636.

In an example embodiment, by considering the positions of the first and second sub-blocks SB1 and SB2 in the first cell region CELL1, the first common source line 3720 may be selected as the transmission path of the erase voltage during the erase operation on the first sub-block SB1, and the first bit line 3760c may be selected as the transmission path of the erase voltage during the erase operation on the second sub-block SB2. By considering the positions of the third and fourth sub-blocks SB3 and SB4 in the second cell region CELL2, the second common source line 3620 may be selected as the transmission path of the erase voltage during the erase operation on the third sub-block SB3, and the second bit line 3660c may be selected as the transmission path of the erase voltage during the erase operation on the fourth sub-block SB4.

Figure 15C:
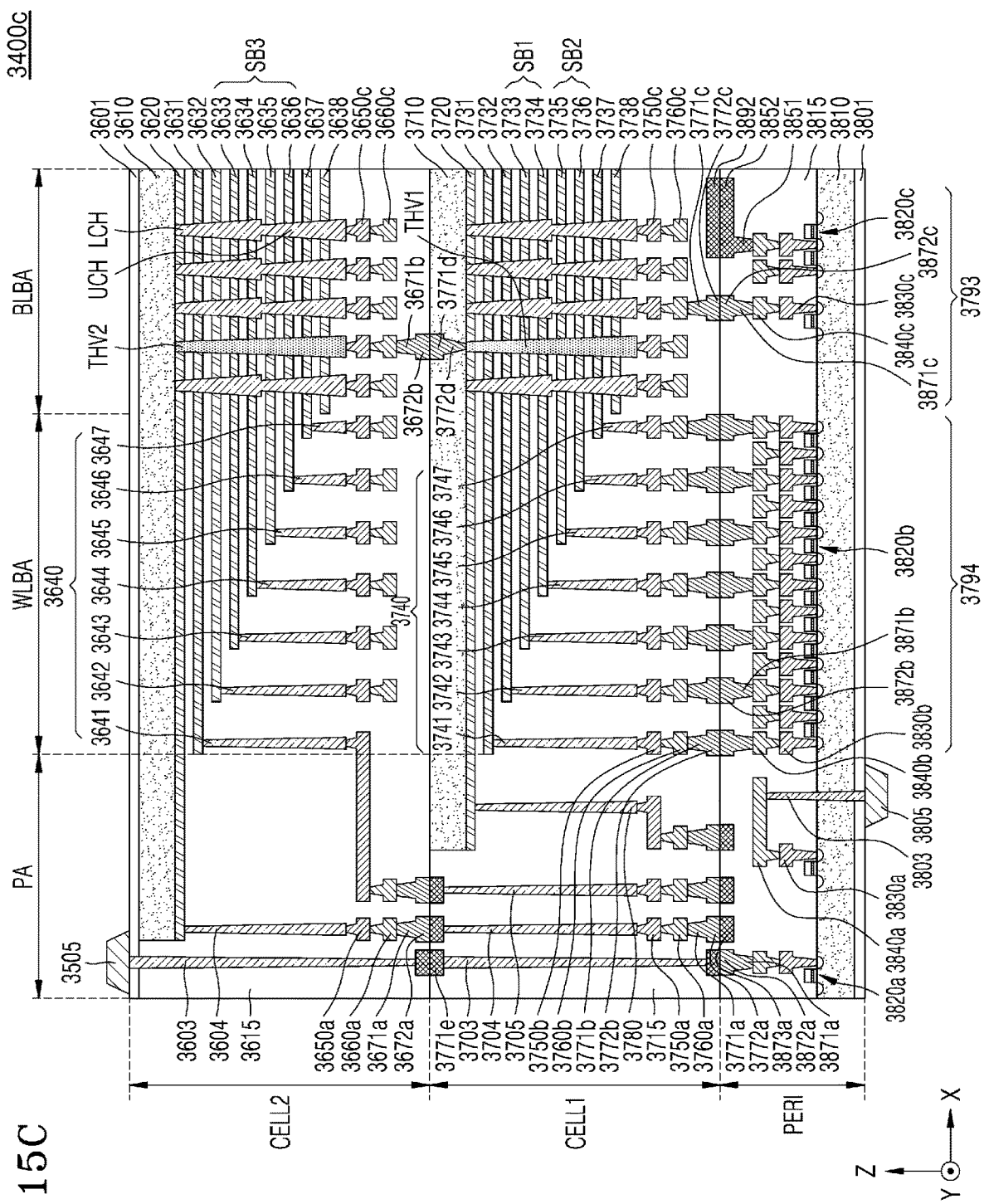

Referring further to FIG. 15C, in an example embodiment, the first cell region CELL1 may include the first sub-block SB1 including the memory cells connected to the word lines 3733 and 3734 and the second sub-block SB2 including the memory cells connected to the word lines 3735 and 3736. The second cell region CELL2 may include the third sub-block SB3 including the memory cells connected to the word lines 3633 to 3636.

In an example embodiment, by considering the positions of the first and second sub-blocks SB1 and SB2 in the first cell region CELL1, the first common source line 3720 may be selected as the transmission path of the erase voltage during the erase operation on the first sub-block SB1, and the first bit line 3760c may be selected as the transmission path of the erase voltage during the erase operation on the second sub-block SB2. During the erase operation on the third sub-block SB3, at least one of the second bit line 3660c and the second common source line 3620 may be selected as the transmission path of the erase voltage.

Figure 15D:
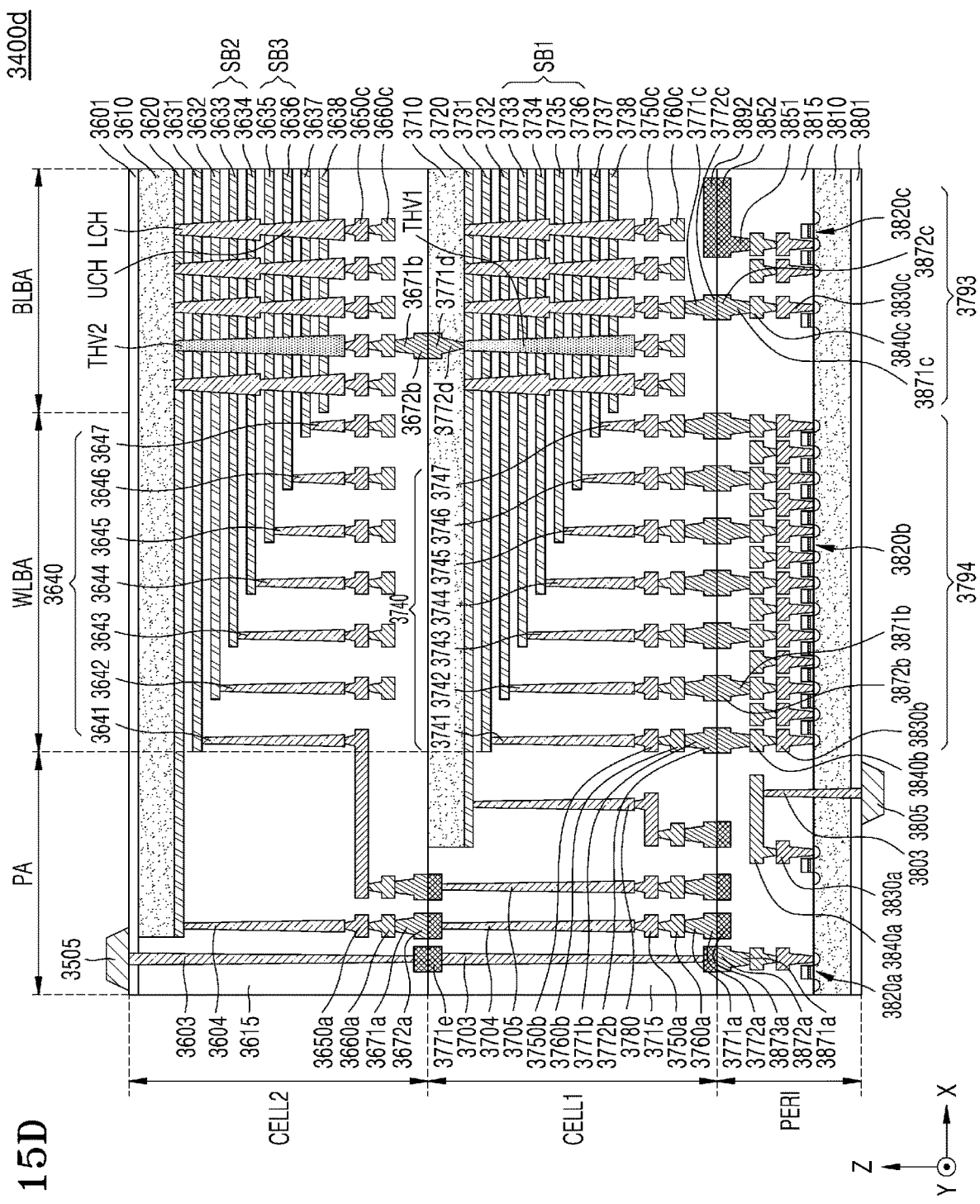

Referring further to FIG. 15D, in an example embodiment, the first cell region CELL1 may include the first sub-block SB1 including the memory cells connected to the word lines 3733 to 3736. The second cell region CELL2 may include the second sub-block SB2 including the memory cells connected to the word lines 3633 and 3634 and the third sub-block SB3 including the memory cells connected to the word lines 3635 and 3636.

In an example embodiment, during the erase operation on the first sub-block SB1, at least one of the first bit line 3760c and the first common source line 3670 may be selected as the transmission path of the erase voltage. By considering the positions of the second and third sub-blocks SB2 and SB3 in the second cell region CELL2, the second common source line 3620 may be selected as the transmission path of the erase voltage during the erase operation on the second sub-block SB2, and the second bit line 3660c may be selected as the transmission path of the erase voltage during the erase operation on the third sub-block SB3.

While the inventive concept has been particularly shown and described with reference to embodiments thereof, it will be understood that various changes in form and details may be made therein without departing from the spirit and scope of the following claims.

What is claimed is:

1. A memory device comprising:
a memory block comprising a plurality of sub-blocks that are connected between a common source line and a plurality of bit lines and vertically stacked; and
a control circuit configured to:
select any one of the common source line and the plurality of bit lines as a transmission path for an erase voltage based on whether a vertical position of a target sub-block to be erased among the plurality of sub-blocks is closer to the common source line or the plurality of bit lines, and
perform an erase operation on the target sub-block using the selected transmission path.

2. The memory device of claim 1, wherein the control circuit is further configured to select the transmission path based on cell types of adjacent sub-blocks disposed on both sides of target sub-block in a vertical direction among the plurality of sub-blocks.

3. The memory device of claim 2, wherein the control circuit is further configured to select the transmission path based on an adjacent sub-block corresponding to a lower level cell type among the cell types when the vertical position of the target sub-block corresponds to a predetermined position.

4. The memory device of claim 2, wherein each of the cell types is any one of a first cell type corresponding to a single-level cell, a second cell type corresponding to a multi-level cell, a third cell type corresponding to a triple-level cell, and a fourth cell type corresponding to a quadruple-level cell.

5. The memory device of claim 2, wherein the control circuit is further configured to:
receive sub-block operation information indicating cell types of the plurality of sub-blocks from a memory controller, and
use the sub-block operation information to select the transmission path.

6. The memory device of claim 1, wherein the memory block further includes:
a first erase transistor connected to the common source line to select the common source line as the transmission path for the erase voltage, and
a second erase transistor connected to the plurality of bit lines to select the plurality of bit lines as the transmission path.

7. The memory device of claim 6, wherein the memory block further includes:
a first gate induced drain leakage (GIDL) transistor connected to the common source line and connected to the first erase transistor,
a ground selection transistor connected to the first GIDL transistor and connected to a memory cell included in one of the plurality of sub-blocks,
a second GIDL transistor connected to one of the plurality of bit lines and connected to the second erase transistor, and
a string selection transistor connected to the second GIDL transistor and connected to a memory cell included in another one of the plurality of sub-blocks.

8. The memory device of claim 7, wherein, when the common source line is selected as the transmission path of the erase voltage, the control circuit is configured to:
float a gate terminal of the first GIDL transistor and a gate terminal of the ground selection transistor at a voltage obtained by subtracting a GIDL voltage from the erase voltage, and
float a gate terminal of the second GIDL transistor and a gate terminal of the string selection transistor at the erase voltage.

9. The memory device of claim 7, wherein, when the plurality of bit lines are selected as the transmission path for the erase voltage, the control circuit is configured to:
float a gate terminal of the second GIDL transistor and a gate terminal of the string selection transistor at a voltage obtained by subtracting a GIDL voltage from the erase voltage, and
float a gate terminal of the first GIDL transistor and a gate terminal of the ground selection transistor at the erase voltage.

10. The memory device of claim 6, wherein, when the common source line is selected as the transmission path for the erase voltage, the control circuit is configured to:
turn on the first erase transistor in response to a voltage obtained by adding the erase voltage to a threshold voltage, and
turn off the second erase transistor in response to a low level voltage.

11. The memory device of claim 6, wherein, when the plurality of bit lines are selected as the transmission path for the erase voltage, the control circuit is configured to:
turn on the second erase transistor in response to a voltage obtained by adding the erase voltage to a threshold voltage, and
turn off the first erase transistor in response to a low level voltage.

12. The memory device of claim 1, wherein a channel shape of first sub-blocks stacked at an upper position among the plurality of sub-blocks is the same as a channel shape of second sub-blocks stacked at a lower position among the plurality of sub-blocks.

13. The memory device of claim 1, wherein the control circuit is included in a peripheral circuit region of a lower chip, and
wherein the plurality of sub-blocks are included in a cell region of an upper chip stacked on the lower chip.

14. The memory device of claim 1, wherein the control circuit is included in a peripheral circuit region of a lower chip, and
wherein the plurality of sub-blocks are included in cell regions of upper chips stacked on the lower chip.

15. The memory device of claim 1, wherein the plurality of sub-blocks include a first sub-block and a second sub-block, and
wherein the number of word lines connected to the first sub-block is different from the number of word lines connected to the second sub-block.

16. An operating method of a memory device comprising:
receiving sub-block operation information about a memory block of the memory device from a memory controller;
updating sub-block erase information indicating a transmission path of an erase voltage for each of a plurality of sub-blocks of the memory block based on the sub-block operation information;
receiving an erase command for a target sub-block to be erased among the plurality of sub-blocks from the memory controller; and
in response to the erase command, performing an erase operation on the target sub-block by using the updated sub-block erase information.

17. The operating method of claim 16, wherein the transmission path of the erase voltage is any one of a common source line and a plurality of bit lines connected to the memory block.

18. The operating method of claim 17, wherein the performing of the erase operation includes:
   turning on or turning off of a first erase transistor connected to the common source line and a second erase transistor connected to the plurality of bit lines.

19. The operating method of claim 16, wherein the sub-block operation information includes information about at least one sub-block whose cell type has been changed by the memory controller among the plurality of sub-blocks.

20. The operating method of claim 16, wherein the updating of the sub-block erase information is performed based on the sub-block operation information indicating at least one of a vertical position of each of the plurality of sub-blocks and a cell type of each of the plurality of sub-blocks.

* * * * *